US012812903B2

(12) United States Patent
Liaw

(10) Patent No.: US 12,812,903 B2
(45) Date of Patent: Nov. 24, 2026

(54) SEMICONDUCTOR STRUCTURE

(71) Applicant: Taiwan Semiconductor Manufacturing Company, Ltd., Hsinchu (TW)

(72) Inventor: Jhon-Jhy Liaw, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 443 days.

(21) Appl. No.: 18/387,949

(22) Filed: Nov. 8, 2023

(65) Prior Publication Data

US 2025/0151325 A1 May 8, 2025

(51) Int. Cl.
*H10D 30/67* (2025.01)
*H10D 30/43* (2025.01)
(Continued)

(52) U.S. Cl.
CPC ......... *H10D 30/6715* (2025.01); *H10D 30/43* (2025.01); *H10D 30/6729* (2025.01);
(Continued)

(58) Field of Classification Search
CPC ............... H10D 30/6715; H10D 30/43; H10D 30/6729; H10D 30/6735; H10D 62/121; H10D 84/0177; H10D 84/851; H10D 64/017; H10D 30/014; H10D 30/6757; H10D 84/014; H10D 84/0158; H10D 84/038; H10D 84/834; H10D 84/85; H10D 84/853; H10D 86/215; H10D 30/6215; H10D 30/0217; H10D 30/024; H10D 30/60–798; H10D 30/021–0415; H10D 84/83–859; H10D 62/364; H10D 84/0128; H10D 84/0167; H10D 62/85–854; H10D 30/751; H10D 30/027–0278; H10D 30/63; H10D 84/016; H10D 84/0195; H10D 30/501–509; H10D 84/0193; H10D 30/031; H10D 30/62; H10D 48/362; H10D 30/472; H10D 30/6713; H10D 30/01; H10D 30/673; H10D 62/80; H10D 62/8303; H10D 62/882; H10D 99/00; H10D 62/118; H10D 62/235; H10D 89/10; H10D 62/292;
(Continued)

(56) References Cited

U.S. PATENT DOCUMENTS

2021/0313442 A1* 10/2021 Suh ..................... H10D 30/014

* cited by examiner

*Primary Examiner* — Moin M Rahman
(74) *Attorney, Agent, or Firm* — Birch, Stewart, Kolasch & Birch, LLP

(57) ABSTRACT

A semiconductor structure is provided. The semiconductor structure includes a substrate, a well, a plurality of channel sheets, a source/drain region, a contact, a gate electrode, a gate dielectric layer and a spacer. The gate electrode includes at least one inner gate electrode and a top gate electrode. The inner gate electrode is located between the plurality of channel sheets. The top gate electrode is located upon a top of the plurality of channel sheets. The top gate electrode includes a first stage top gate and a second stage top gate. The first stage top gate is stacked on the second stage top gate, and a first gate length of the first stage top gate is less than a second gate length of the second stage top gate. The gate dielectric layer surrounds the gate electrode. The spacer includes at least one inner spacer and a top spacer.

20 Claims, 20 Drawing Sheets

(51) Int. Cl.
*H10D 62/10* (2025.01)
*H10D 84/85* (2025.01)

(52) U.S. Cl.
CPC ....... *H10D 30/6735* (2025.01); *H10D 62/121* (2025.01); *H10D 84/859* (2025.01)

(58) Field of Classification Search
CPC ............... H10D 64/691; H10D 64/685; H10D 84/0144; H10D 84/0181; H10D 89/601; H10D 30/6739; H01L 21/02068; H01L 21/32134; H01L 21/32136; H01L 21/32137; H01L 21/3213; H01L 21/0228; H10B 63/34; B82Y 10/00
See application file for complete search history.

SEMICONDUCTOR STRUCTURE

BACKGROUND

The disclosure relates in general to an electronic component, and more particularly to a semiconductor structure.

In nm (22 nm and beyond) generations, the FinFET devices have become the most popular candidate for high performance and lower leakage applications. This is due to additional sidewalls device width (Ion performance) as well as better short channel control (subthreshold leakage). However, the FinFET device still has a fin bottom portion out of gate control problem and therefore limited the continue shrunk capability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
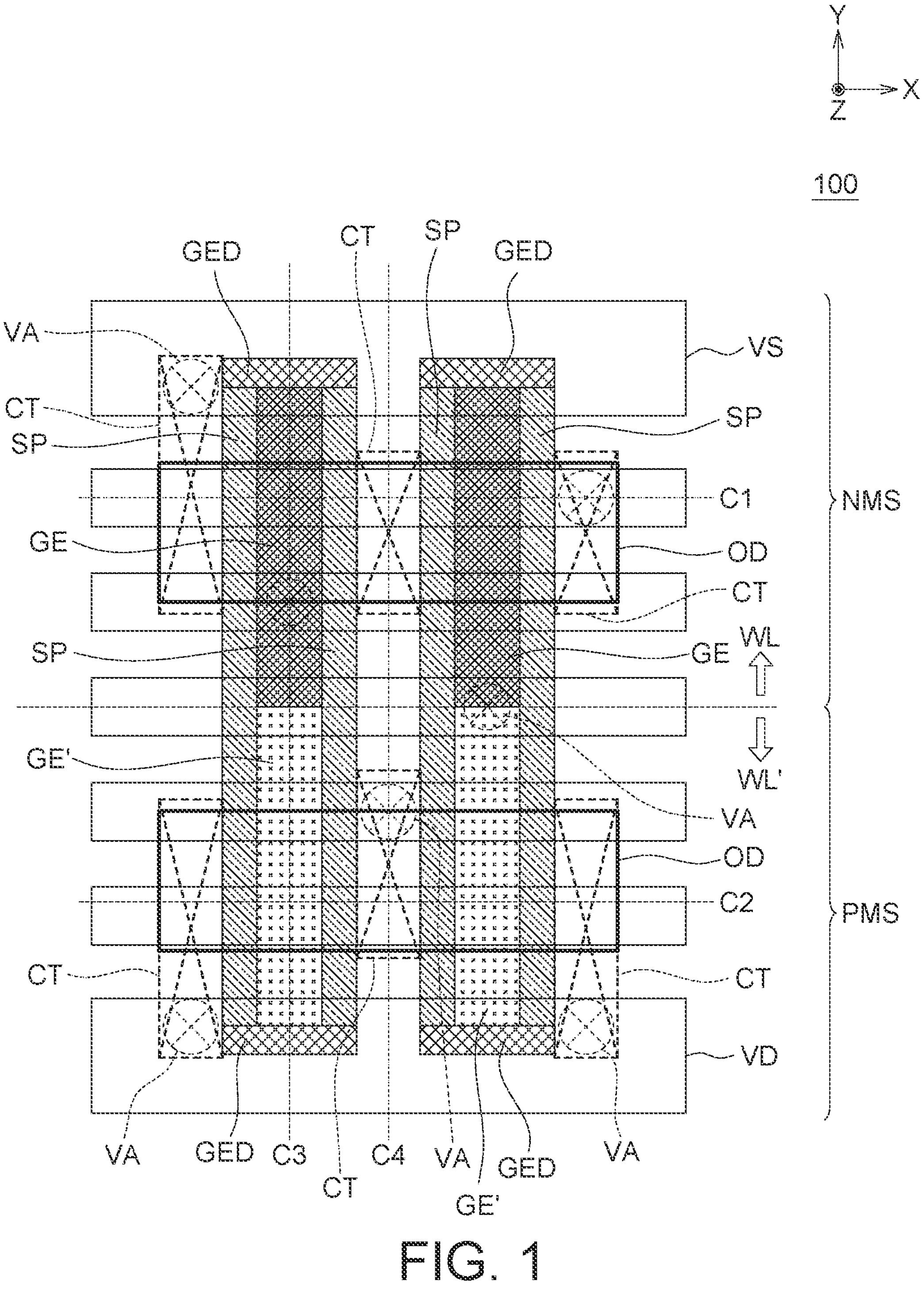
FIG. 1 shows a top view of a semiconductor structure 100 according to one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In nm (22 nm and beyond) generations, the FinFET devices have become the most popular candidate for high performance and lower leakage applications. This is due to additional sidewalls device width (Ion performance) as well as better short channel control (subthreshold leakage). However, the FinFET device still has a fin bottom portion out of gate control problem and therefore limited the continue shrunk capability. To solve FinFET device channel bottom portion channel control issue, the GAA (gate all around) device structure was proposed as the successor of FinFET device due to it allows for more aggressive gate length scaling for both performance and density improvement. To mitigate design effort, a fully FinFET device layout compatible GAA device structure “Vertically Stacked Multiple Channels horizontal NanoSheet (VS-GAA)” has become a best candidate for future 5 nm generation and low supply voltage applications. The VS-GAA devices can be fully FinFET device layout compatible, also performed outstanding performance on gate control ability, lower leakage current, shrink capability. The general process for VS-GAA formation comprises SiGe/Si/SiGe. epi-growth, and in dummy gate opening, the SiGe is selectively removed to expose the Si channel, and then gate dielectric and metal gate formation.

The bridge margin between the contact and adjacent gate is getting narrow due to continuous shrinkage of gate pitch. To have larger isolation margin, the thicker spacer layer is required. But this is conflict with S/D epi formation margin. To have larger gate to contact isolation margin as well as lower capacitance will become a key topic for the GAA technology.

Please refer to FIG. 1, which shows a top view of a semiconductor structure 100 according to one embodiment. The semiconductor structure 100 is, for example, a GAA structure 100. In the example shown in the FIG. 1, a Vss conductor VS, a Vdd conductor VD, a plurality of active regions OD, a plurality of wells WL, WL', a plurality of spacers SP, a plurality of gate electrodes GE, GE', a plurality of contacts CT, a plurality of vias VA, a plurality of gate end dielectric layers GED of the semiconductor structure 100 are shown. The GAA structure 100 includes a N-type metal oxide semiconductor field effect transistor (NMOSFET) NMS and a P-type metal oxide semiconductor field effect transistor (PMOSFET) PMS. The well WL of the NMOSFET NMS is, for example, a P-type well. The well WL' of the PMOSFET PMS is, for example, a N-type well. The material of the gate electrode GE of the NMOSFET NMS and the material of the gate electrode GE' of the PMOSFET are the same or different. Each of the gate electrodes GE and the gate electrodes GE' is disposed between two of the spacers SP. The spacers SP are extended from the NMOSFET NMS to the PMOSFET PMS. The gate electrodes GE, GE' and the spacers SP are extended along the Y axis direction, for example. The active regions OD, the Vss conductor VS and the Vdd conductor VD are extended along the X axis direction.

In some embodiments, the semiconductor structure 100 may be included in a microprocessor, a memory, and/or other IC device. In some embodiments, the semiconductor structure 100 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. The Figures in this application have been simplified for the sake of clarity to better understand the inventive concepts of the present disclosure. Additional features can be added in the semiconductor structure 100, and some of the features described below can be replaced, modified, or eliminated in other embodiments of the semiconductor structure 100.

Figure 2:
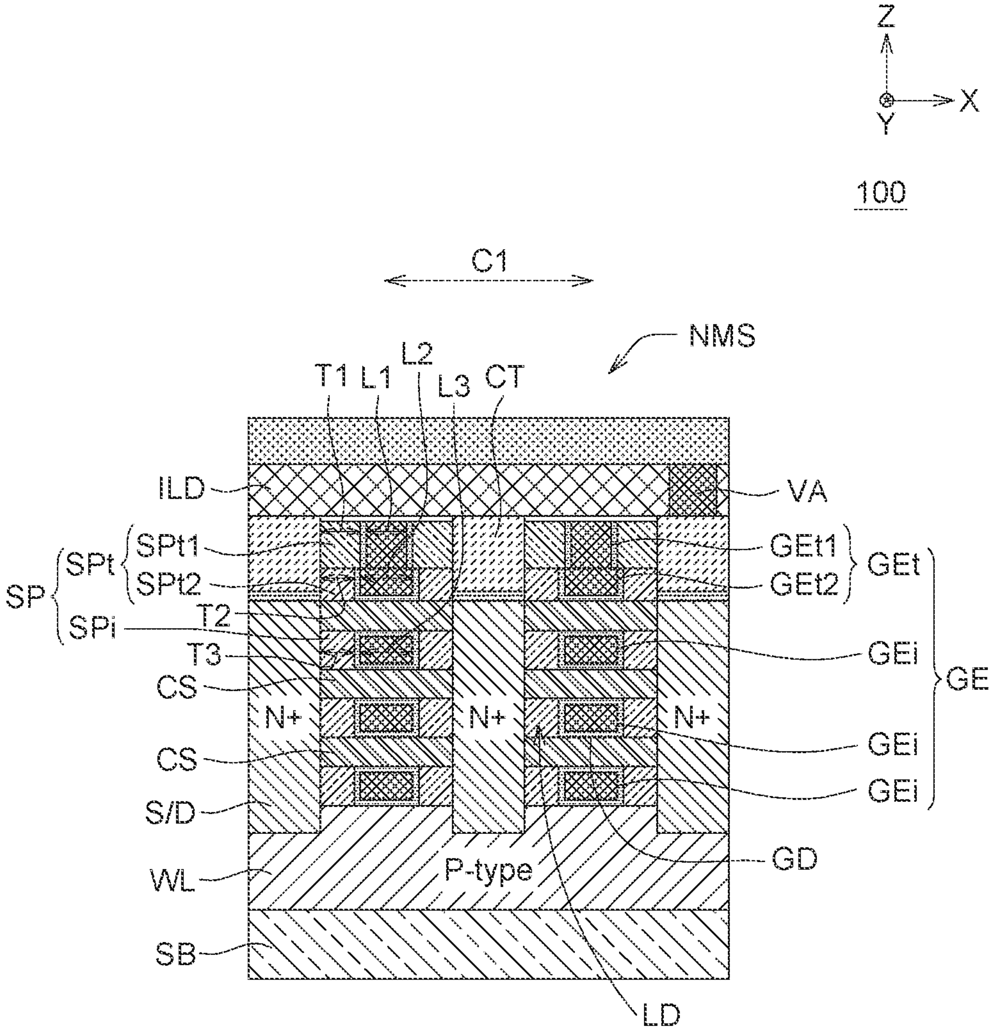
FIG. 2 shows a cross section view of the semiconductor structure 100 along a cutting line C1 according to one embodiment.
Figure 3:
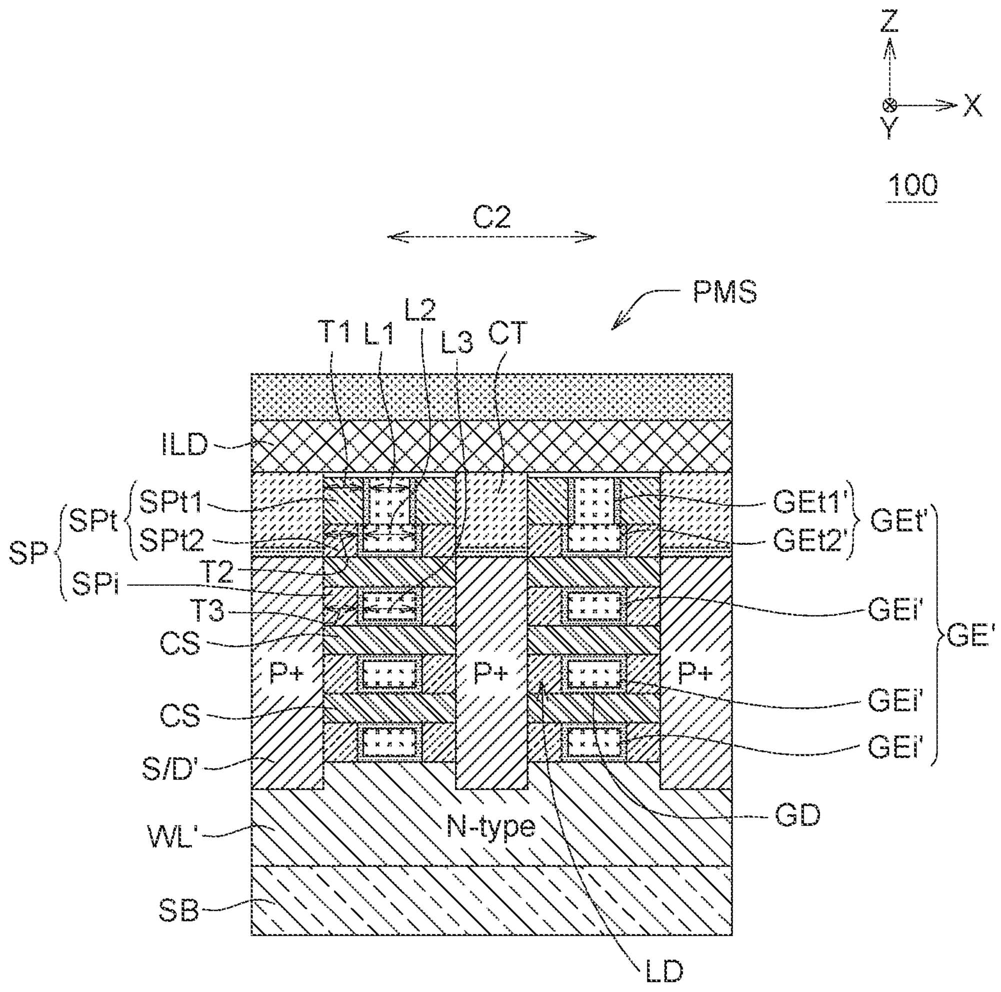
FIG. 3 shows a cross section view of the semiconductor structure 100 along a cutting line C2 according to one embodiment.
Figure 4:
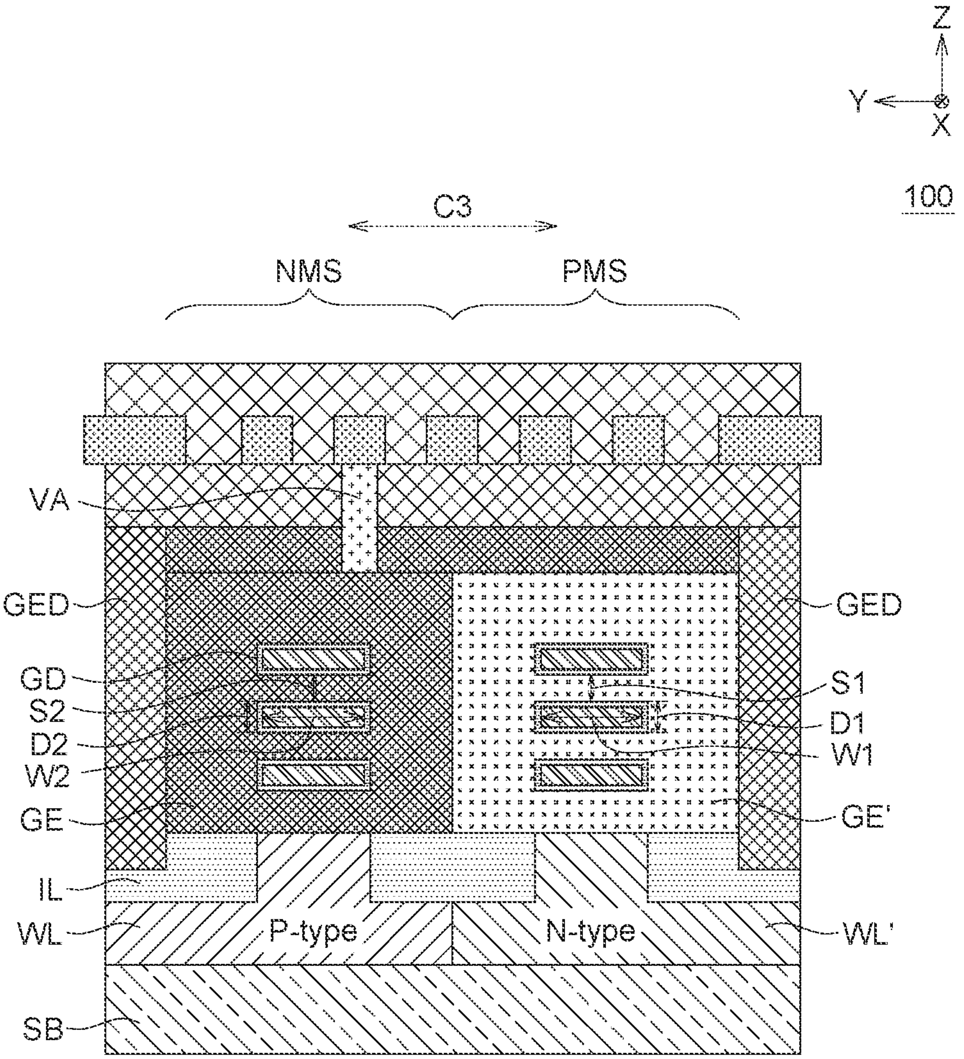
FIG. 4 shows a cross section view of the semiconductor structure 100 along a cutting line C3 according to one embodiment.
Figure 5:
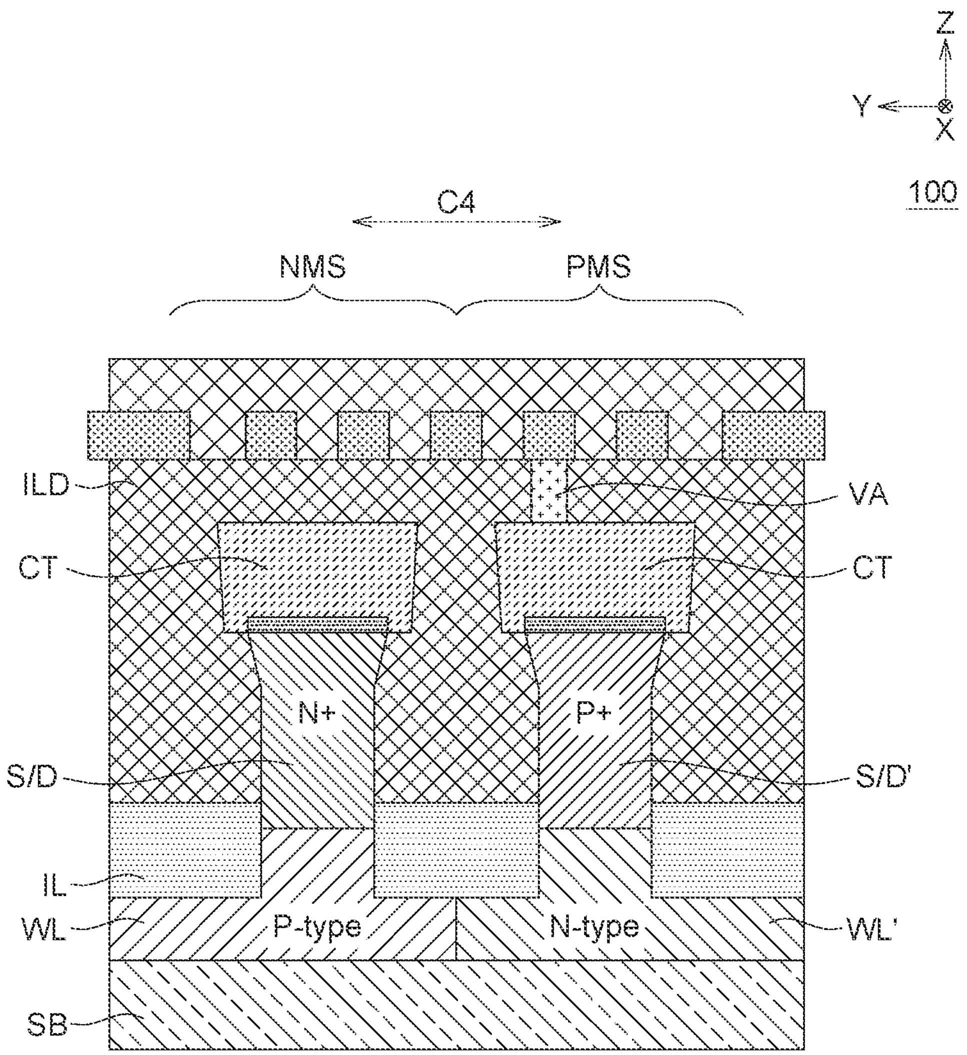
FIG. 5 shows a cross section view of the semiconductor structure 100 along a cutting line C4 according to one embodiment.

FIG. 2 shows a cross section view of the semiconductor structure 100 along a cutting line C1 according to one embodiment. FIG. 3 shows a cross section view of the semiconductor structure 100 along a cutting line C2 according to one embodiment. FIG. 4 shows a cross section view of the semiconductor structure 100 along a cutting line C3 according to one embodiment. FIG. 5 shows a cross section view of the semiconductor structure 100 along a cutting line C4 according to one embodiment.

As shown in the FIG. 2, a substrate SB, the well WL, a plurality of channel sheets CS, a plurality of source/drain regions S/D, a plurality of contacts CT, the gate electrodes GE, a plurality of gate dielectric layers GD, the spacers SP, the interlayer dielectric layer ILD and the via VA of the NOMS NMS of the semiconductor structure 100 are shown.

As shown in the FIG. 3, the substrate SB, the well WL', the channel sheets CS, a plurality of source/drain regions S/D', the contacts CT, the gate electrodes GE', a plurality of gate dielectric layers GD, the spacers SP, the interlayer dielectric layer ILD and the via VA of the POMS PMS of the semiconductor structure 100 are shown.

As shown in the FIG. 4, the substrate SB, the well WL, a plurality of isolation regions IL, the channel sheets CS, the gate electrodes GE, the gate dielectric layers GD, the gate end dielectric layers GED and the via VA of the NMOS NMS of the semiconductor structure 100, and the substrate SB, the well WL', the isolation regions IL, the channel sheets CS, the gate electrodes GE', the gate dielectric layers GD, the gate end dielectric layers GED and the via VA of the PMOS PMS of the semiconductor structure 100 are shown.

As shown in the FIG. 5, the substrate SB, the well WL, the isolation regions IL, the source/drain region S/D, the contact CT and the interlayer dielectric layer ILD of the NMOS NMS of the semiconductor structure 100, and the substrate SB, the well WL', the isolation regions IL, the source/drain region S/D', the contact CT, the interlayer dielectric layer ILD and the via VA of the PMOS PMS of the semiconductor structure 100 are shown.

In one embodiment, as shown in the FIGS. 2 to 5, the substrate SB includes Silicon, such as a Silicon wafer. Alternatively, the substrate SB may include another elementary semiconductor, such as Germanium (Ge); a compound semiconductor, such as Silicon carbide, Gallium Arsenide (GaAs), Gallium Phosphide (GaP), Indium Phosphide (InP), Indium Arsenide (InAs), and/or Indium Antimonide (In Sb); an alloy semiconductor, such as Silicon Germanium (SiGe), GaAsP, AlInAs, AlGaAs, GaInAs, GaInP, and/or GaInAsP; or combinations thereof. Alternatively, the substrate SB is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In one embodiment, as shown in the FIGS. 1, 2, 4, 5, the well WL is, for example, a P-type well and is disposed in the substrate SB. In one embodiment, as shown in the FIGS. 1, 3, 4, 5, the well WL' is, for example, a N-type well and is disposed in the substrate SB.

In the present embodiment, the wells WL, WL' include the same semiconductor material(s) as the substrate SB. The well WL may be doped with p-type dopants, such as boron, indium, other p-type dopant, or combinations thereof, configured for the NMOS NMS. The well WL' may be doped with n-type dopants, such as phosphorus, arsenic, other n-type dopant, or combinations thereof, configured for the PMOS PMS. In some implementations, the well WL is formed with a combination of p-type dopants and n-type dopants but with a net effect of being n-type doped. In some implementations, the well WL' is formed with a combination of p-type dopants and n-type dopants but with a net effect of being p-type doped. The various doped regions can be formed directly on and/or in the substrate SB, by an ion implantation process, a diffusion process, and/or other suitable doping process. The dopant concentration in the well WL may be in a range of about 1E16 atom/cm^3 to about 1E19 atom/cm^3 in some embodiments, depending on well resistance requirements. The dopant concentration in the well WL' may be in a range of about 1E16 atom/cm^3 to about 1E19 atom/cm^3 in some embodiments, depending on well resistance requirements.

As shown in the FIGS. 4 and 5, the isolation regions IL are located in the wells WL, WL'. The isolation regions IL may include Silicon oxide, Silicon nitride, Silicon oxynitride, other suitable isolation material (for example, including Silicon, Oxygen, Nitrogen, Carbon, or other suitable isolation constituent), or combinations thereof. The isolation regions IL may include different structures, such as shallow trench isolation (STI) structures, deep trench isolation (DTI) structures, and/or local oxidation of silicon (LOCOS) structures. For example, the isolation regions IL may include STI features that define and electrically isolate the doped regions. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

As shown in the FIG. 2, the source/drain regions S/D are disposed above the wells WL and electrically connected to the LDD regions LD. Each of the source/drain regions S/D includes epi profile. In the NMOSFET NMS, the epi material is SiP content, SiC content, SiPC, SiAs, Si, the like, or the combination thereof. The phosphorus doping concentration of source/drain regions S/D is within a range of 2E19/cm^3 to 3E21/cm^3.

As shown in the FIG. 3, the source/drain regions S/D' are disposed above the wells WL' and electrically connected to the LDD regions LD. Each of the source/drain regions S/D' includes epi profile. In the PMOSFET PMS, the epi material is SiGe with Boron doped, SiGeC within Boron doped, Ge with Boron doped, Si with Boron doped, the like or the combination thereof. The Boron doping concentration of the source/drain regions S/D is within a range of 1E19/cm^3 to 6E20/cm^3.

As shown in the FIGS. 2 and 3, the source/drain regions S/D, S/D' may be formed using epitaxial growth. For example, a semiconductor material is epitaxially grown from portions of the substrate SB, the wells WL, WL', and the channel sheets CS, forming epitaxial source/drain regions S/D, S/D'. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the substrate SB, the wells WL, WL', and the channel sheets CS. In some embodiments, the epitaxial source/drain regions S/D may include Silicon and may be doped with Carbon, Phosphorous, Arsenic, other n-type dopant, or combinations thereof (for example, forming Si:C epitaxial source/drain regions S/D, Si:P epitaxial source/drain regions S/D, or Si:C:P epitaxial source/drain regions S/D). In some embodiments, the epitaxial source/drain regions S/D' may include silicon germanium or germanium and may be doped with boron, other p-type dopant, or combinations thereof (for example, forming Si:Ge:B epitaxial source/drain regions S/D'). In some embodiments, the epitaxial source/drain regions S/D and/or S/D' include more than one epitaxial semiconductor layer, where the epitaxial semiconductor layers can include the same or different materials and/or dopant concentrations. In some embodiments, the epitaxial source/drain regions S/D and/or S/D' include materials and/or dopants that achieve desired tensile stress and/or compressive stress in respective the channel sheets CS. In some embodiments, the epitaxial source/drain regions S/D and S/D' are doped during deposition by adding impurities to a source material of the epitaxy process (i.e., in-situ). In some embodiments, epitaxial source/drain regions S/D and S/D' are doped by an ion implantation process subsequent to a deposition process. In some embodiments, annealing processes (e.g., rapid thermal annealing (RTA) and/or laser annealing) are performed to activate dopants in epitaxial source/drain regions S/D and S/D'. In some embodiments, epitaxial source/drain regions S/D and S/D' are formed in separate processing sequences that include, for example, masking PMOS GAA transistor regions when forming epitaxial source/drain regions S/D in NMOSFET NMS and masking NMOSFET NMS when forming epitaxial source/drain region S/D' in PMOSFET PMS.

As shown in the FIGS. 2 and 3, the lightly doped source/drain (LDD) regions LD are between each of the channel sheets CS and the source/drain regions S/D, S/D'. The LDD regions LD between the channel sheets CS and the source/drain region S/D, S/D' are surrounded by the inner spacers SPi, and the LDD regions LD between the topmost channel sheet CS and the source/drain regions S/D, S/D' are surrounded by both of the inner spacer SPi and the top spacer SPt. The LDD regions LD provide further device performance enhancement (such as short channel control) to the semiconductor structure 100.

As shown in the FIGS. 2 and 3, the lightly doped source/drain (LDD) regions LD are between each of the channel sheets CS and the source/drain regions S/D, S/D'. The LDD regions LD between the channel sheets CS and the source/drain region S/D, S/D' are surrounded by the inner spacers SPi, and the LDD regions LD between the topmost channel sheet CS and the source/drain regions S/D, S/D' are surrounded by both of the inner spacer SPi and the top spacer SPt. The LDD regions LD provide further device performance enhance (such as short channel control) to the semiconductor structure 100.

As shown in the FIGS. 2 to 4, the vertically sheet pitch of the channel region of the vertically stacked channel sheets CS is, for example, within a range of 12 nm to 20 nm. The channel (sheet) thickness is within a range of 4 nm to 8 nm. The channel (sheet) space is within a range of 4 nm to 20 nm.

As shown in the FIGS. 2 to 4, the stack of channel sheets CS serves as the transistor channels for the respective GAA devices. The channel sheets CS may include single crystalline silicon. Alternatively, the channel sheets CS may comprise Germanium, Silicon Germanium, or another suitable semiconductor material(s). In the present embodiment, the channel sheets CS are undoped. For example, the dopant concentration in the channel sheets CS may be lower than about 1E16 atom/cm^3. In some embodiments, the channel sheets CS may be unintentionally doped with a very low concentration of dopants. For example, the dopant concentration in the channel sheets CS may be lower than about 5E16 atom/cm^3. Initially, the channel sheets CS are formed as part of a semiconductor layer stack that includes the channel sheets CS and some sacrificial semiconductor layers of a different material. During a gate replacement process, the semiconductor layer stack is selectively etched to remove the sacrificial semiconductor layers, leaving the channel sheets CS suspended over the substrate SB and between the respective source/drain regions S/D, S/D'. In various embodiments, the number of channel sheets CS in a GAA device may be in a range of 2 to 10, such as 3 or 4.

As shown in the FIG. 4, the channel sheets CS for the PMOSFET PMS are separated from each other by a spacing S1 along the z axis direction, and the channel sheets CS for the NMOSFET NMS are separated from each other by a spacing S2 along the z axis direction. In the depicted embodiment, the spacing S1 is about equal to the spacing S2 (for example, the spacing S1 and the spacing S2 are within 5% from each other), though the present disclosure contemplates embodiments where the spacing S1 is different than the spacing S2. Further, the channel sheets CS for the PMOSFET PMS have a width W1 along the x axis direction and a thickness D1 along the z axis direction, and the channel sheets CS for NMOSFET NMS have a width W2 along the x axis direction and a thickness D2 along the z axis direction. In the depicted embodiment, thickness D1 is about equal to the thickness D2 (for example, the thickness D1 and the thickness D2 are within 5% from each other), though the present disclosure contemplates embodiments where the thickness D1 is different than the thickness D2. In some embodiments, each of the thicknesses D1 and the thickness D2 may be in a range of about 4 nm to about 8 nm, and each of the spacing S1 and the spacing S2 may be in a range of about 6 nm to about 15 nm. Further, the sum of the thickness D1 and the spacing S1 (and the sum of the thickness T2 and the spacing S2) may be in a range of about 10 nm to 23 nm in some embodiments. In an embodiment, the width W1 is about equal to the width W2. In another embodiment, the width W2 is different from the width W1 depending on design objectives. For example, the width W2 can be designed to be larger than the width W1 to boost NMOSFET GAA's performance. The present disclosure contemplates embodiments where the width W1 and the width W2 have any configurations including the width W1 is equal to, smaller than, or greater than the width W2. Each of with the widths W1 and W2 may be in a range of about 4 nm to about 70 nm in various embodiments. In some embodiments, the channel sheets CS may be cylindrical-shaped (e.g., nanowire), rectangular-shaped (e.g., nanobar), sheet-shaped (e.g., nanosheet), etc.), or have other suitable shapes.

As shown in the FIGS. 1, 2, 3, 5, the contacts CT are electrically connected to the source/drain regions S/D, S/D'. The gate electrodes GE surround the channel sheets CS. A material of the contacts CT comprises single metal material or multiple metal layers. The material of the contacts CT is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

As shown in the FIGS. 1, 2, 4, each of the gate electrodes GE includes at least one inner gate electrode GEi and a top gate electrode GEt. Each of the inner gate electrodes GEi is located between the channel sheets CS. Each of the top gate electrodes GEt are located upon a top of the channel sheets CS.

As shown in the FIGS. 1, 3, 4, each of the gate electrodes GE' includes at least one inner gate electrode GEi' and a top gate electrode GEt'. Each of the inner gate electrodes GEi' is located between the channel sheets CS. Each of the top gate electrodes GEt' are located upon a top of the channel sheets CS.

The inner gate electrodes GEi, GEi' have the same gate lengths. Therefore, all the channel regions have substantially the same gate length for Ion/Ioff improvement as well as drain-induced barrier lowering (DIBL) and threshold voltage (Vt) mis-match reduction. In one embodiment, a material of the inner gate electrodes GEi, GEi' and a material of the top gate electrodes GEt, GEt' may be different.

As shown in the FIG. 2, each of the gate electrodes GE for the NMOSFET NMS is disposed between a pair of N-type source/drain regions S/D'. As shown in the FIG. 3, each of the gate electrodes GE' for the PMOSFET PMS is disposed between a pair of P-type source/drain regions S/D'. In one embodiment, some gate electrodes GE, GE' straddle the PMOSFET PMS and the NMOSFET NMS, and becomes a common gate for the NMOSFET NMS and the PMOSFET PMS.

As shown in the FIG. 2, each of the top gate electrodes GEt is a two stages structure. In the two stages structure, a top narrower part is located upon a bottom wider part. For example, each of the top gate electrode GEt includes a first stage top gate GEt1 and a second stage top gate GEt2. The first stage top gate GEt1 is stacked on the second stage top gate GEt2.

As shown in the FIG. 3, each of the top gate electrodes GEt' is a two stages structure. In the two stages structure, a top narrower part is located upon a bottom wider part. For example, each of the top gate electrode GEt' includes a first stage top gate GEt1' and a second stage top gate GEt2'. The first stage top gate GEt1' is stacked on the second stage top gate GEt2'.

A first gate length L1 of the first stage top gate GEt1, GEt1' is less than a second gate length L2 of the second stage top gate GEt2, GEt2'. A ratio of the second gate length L2 to the first gate length L1 is 1.05 to 1.4. A third gate length L3 of the inner gate electrode GEi, GEi' is substantially equal to the second gate length L2.

The first gate length L1 is, for example, within 5 nm to 20 nm. The second gate length L2 is, for example, within 5.5 nm to 24 nm. The third gate length L3 is, for example, within 5.5 nm to 24 nm.

Each of the first stage top gates GEt1, GEt1' in the top gate electrodes GEt, GEt' has a less gate length, so the capacitance could be lowered, and the density could be improved. Each of the second stage top gates GEt2, GEt2' has a longer gate length, so the leakage could be reduced.

As shown in the FIGS. 2 and 3, the gate dielectric layers GD surround the gate electrodes GE, GE'. Each of the gate dielectric layers GD includes oxide with Nitrogen doped dielectric combined with metal content high-K dielectric (K is larger than 3). The thickness of each of the gate dielectric layers GD is 0.5 nm to 3 nm. A material of the gate dielectric layers GD is Tantalum oxide, such as Ta2O5, Aluminum oxide, such as Al2O3, Hf content oxide, Titanium content oxide, Zirconium content oxide, Lanthanum content oxide, high-K material (K is equal to or larger than 9), the like or a combination thereof.

As shown in the FIGS. 2 and 3, each of the gate dielectric layers GD wrap around each of the channel sheets CS. Each of the gate dielectric layers GD [282] may include a high-k dielectric material such as HfO2, HfSiO, HfSiO4, HfSiON, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3 (BTO), (Ba,Sr) TiO3 (BST), Si3N4, hafnium dioxide-alumina (HfO2-Al2O3) alloy, other suitable high-k dielectric material, or combinations thereof. High-k dielectric material generally refers to dielectric materials having a high dielectric constant, for example, greater than that of silicon oxide (k≈3.9). The gate dielectric layers GD may be formed by chemical oxidation, thermal oxidation, atomic layer deposition (ALD), chemical vapor deposition (CVD), and/or other suitable methods, and may have a thickness in a range of about 0.5 nm to about 3 nm. In some embodiments, the gate electrodes GE, GE' further include an interfacial layer between the gate dielectric layers GD and the channel sheets CS. The interfacial layer may include silicon dioxide, silicon oxynitride, or other suitable materials. In some embodiments, each of the gate electrodes GE includes an n-type work function layer for NMOSFET NMS, and each of the gate electrodes GE' includes a p-type work function layer for PMOSFET PMS. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. Since the gate electrodes GE, GE' includes a high-k dielectric layer and metal layer(s), it is also referred to as a high-k metal gate.

As shown in the FIGS. 2 and 3, each of the spacers SP includes a plurality of inner spacers SPi and a top spacer SPt. Each of the inner spacer SPi is located between one of the inner gate electrodes GEi, GEi' and one of the source/drain regions S/D, S/D'. Each of the top spacer SPt is located between one of the top gate electrodes GEt, GEt' and one of the contacts CT.

As shown in the FIGS. 2 and 3, each of the top spacers SPt is a two stages structure. In the two stages structure, one top thicker part is located upon a bottom thinner part. For example, each of the top spacers SPt includes a first stage top spacer SPt1 and a second stage top spacer SPt2. Each of the first stage top spacers SPt1 is stacked on the second stage top spacer SPt2. Each of the first stage top spacers SPt1 is located between one of the first stage top gates GEt1, GEt1' and one of the contacts CT. Each of the second stage top spacers SPt2 is located between one of the second stage top gates GEt2, GEt2' and one of the contacts CT.

As shown in the FIGS. 2 and 3, a material of each of the first stage top spacers SPt1 is different from a material of each of the second stage top spacers SPt2. In one embodiment, a dielectric constant of each of the inner spacers SPi is larger than a dielectric constant of each of the top spacers SPt. In another embodiment, a dielectric constant of each of the inner spacers SPi is larger than a dielectric constant of each of the top spacers SPt. Each of the first stage top spacers SPt1 is a single layer structure or a multiple layers structure. A material of the first stage top spacers SPt1 is Silicon oxide ($SiO_2$), Silicon Oxynitride (SiON), Silicon oxycarbide (SiOC), Silicon oxycarbonitride (SiOCN), Silicon nitride ($Si_3N_4$), Carbondoped oxide, Nitrogen doped oxide, Porous oxide, air gap, the like or a combination thereof. A material of the inner spacers SPi is Silicon oxide ($SiO_2$), Silicon oxynitride (SiON), Silicon oxycarbide (SiOC), Silicon oxycarbonitride (SiOCN), air gap, the like or a combination thereof.

As shown in the FIGS. 2 and 3, a first thickness T1 of each of the first stage top spacers SPt1 is larger than a second thickness T2 of each of the second stage top spacers SPt2. A ratio of the first thickness T1 to the second thickness T2 is 1.05 to 1.5. A difference between the first thickness T1 and the second thickness T2 is 0.5 nm to 3 nm.

As shown in the FIGS. 2 and 3, the first thickness T1 is, for example, within a range of 5 nm to 14 nm. The second thickness T2 is, for example, within a range of 1 nm to 10 nm. A third thickness T3 of the inner spacer SPi is, for example, within a range of 2 nm to 10 nm. The third thickness T3 is substantially equal to the second thickness T2.

As shown in the FIGS. 2 and 3, the first stage top spacer SPt1 has thicker thickness, so the capacitance between the contact CT and the gate electrode GE could be reduced and breakdown voltage for the contact CT to the gate electrode GE could be improved to enhance the reliability.

As shown in the FIGS. 2 and 3, the second stage top spacer SPt2 has thinner thickness, so the LDD region LD is shortened and the channel resistance is reduced to benefit the Ion performance.

As shown in the FIG. 1, the gate end dielectric layers GED are disposed at ends of the gate electrodes GE, GE' and the top spacers SPt. The top spacers SPt, the inner spacers SPi, and gate end dielectric layers GED provide isolation functions—isolating the gate electrode GE, GE' from each other and from nearby conductors including the source/drain regions S/D and S/D'. In an embodiment, the materials for the top spacers SPt, the inner spacers SPi, and the gate end dielectric layers GED are different from each other and the gate end dielectric layer GED have the highest dielectric constant among the three. In an embodiment, the gate end dielectric layers GED include a high-k material, such as selected from a group consisting of $Si_3N_4$, nitrogen-containing oxide, carbon-containing oxide, dielectric metal oxide such as $HfO_2$, HfSiO, $HfSiO_4$, HfSiON, HfLaO, HfTaO, HfTiO, HfZrO, HfAlOx, ZrO, $ZrO_2$, $ZrSiO_2$, AlO, AlSiO, $Al_2O_3$, TiO, $TiO_2$, LaO, LaSiO, Ta203, $Ta_2O_5$, $Y_2O_3$, $SrTiO_3$, BaZrO, $BaTiO_3$ (BTO), (Ba,Sr) $TiO_3$ (BST), hafnium dioxide-alumina ($HfO_2$-$Al_2O_3$) alloy, other suitable high-k dielectric material, or combinations thereof. In a further embodiment, the inner spacers SPi have a higher effective dielectric constant than the top spacers SPt. For example, the inner spacers SPi may include a material selected from a group consisting of $SiO_2$, $Si_3N_4$, SiON, SiOC, SiOCN, nitride base dielectric material, air gap, or a combination thereof; and the top spacers SPt may include a material selected from a group consisting of $SiO_2$, $Si_3N_4$, carbon doped oxide, nitrogen doped oxide, porous oxide, air gap, or a combination thereof.

As shown in the FIGS. 2, 3, the interlayer dielectric layer ILD is disposed over the contacts CT, and the top gate electrodes GEt, GEt'. The source/drain regions S/D, S/D', the contacts CT, the gate electrodes GE, GE', the top spacers SPt, the inner spacers SPi and the gate end dielectric layers GED are embedded in the interlayer dielectric layer ILD. The interlayer dielectric layer ILD may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The interlayer dielectric layer ILD may be formed by PECVD (plasma enhanced CVD), FCVD (flowable CVD), or other suitable methods.

According to the embodiments described in the FIGS. 1 to 5, two stages structure is used for the top gate GEt1, GEt1', the first stage top gate GEt1, GEt1' in the top gate electrodes GEt, GEt' has a less gate length, so the capacitance could be lowered, and the density could be improved. The second stage top gate GEt2, GEt2' has a longer gate length, so the leakage could be reduced.

According to the embodiments described in the FIGS. 1 to 5, two stages structure is used for the top spacer SPt. The first stage top spacer SPt1 has thicker thickness, so the capacitance between the contact CT and the gate electrode GE could be reduced and breakdown voltage for the contact CT to the gate electrode GE could be improved to enhance the reliability.

In the embodiments described in the FIGS. 1 to 5, the source/drain regions S/D are directly connected to the well WL in the NMOSFET NMS and the source/drain regions S/D' are directly connected the well WL' in the PMOSFET PMS. In other embodiments, an isolation layer which is a bottom dielectric layer or an un-doped silicon epi layer may be formed between the source/drain region S/D, S/D' and the well WL, WL'.

Figure 6:
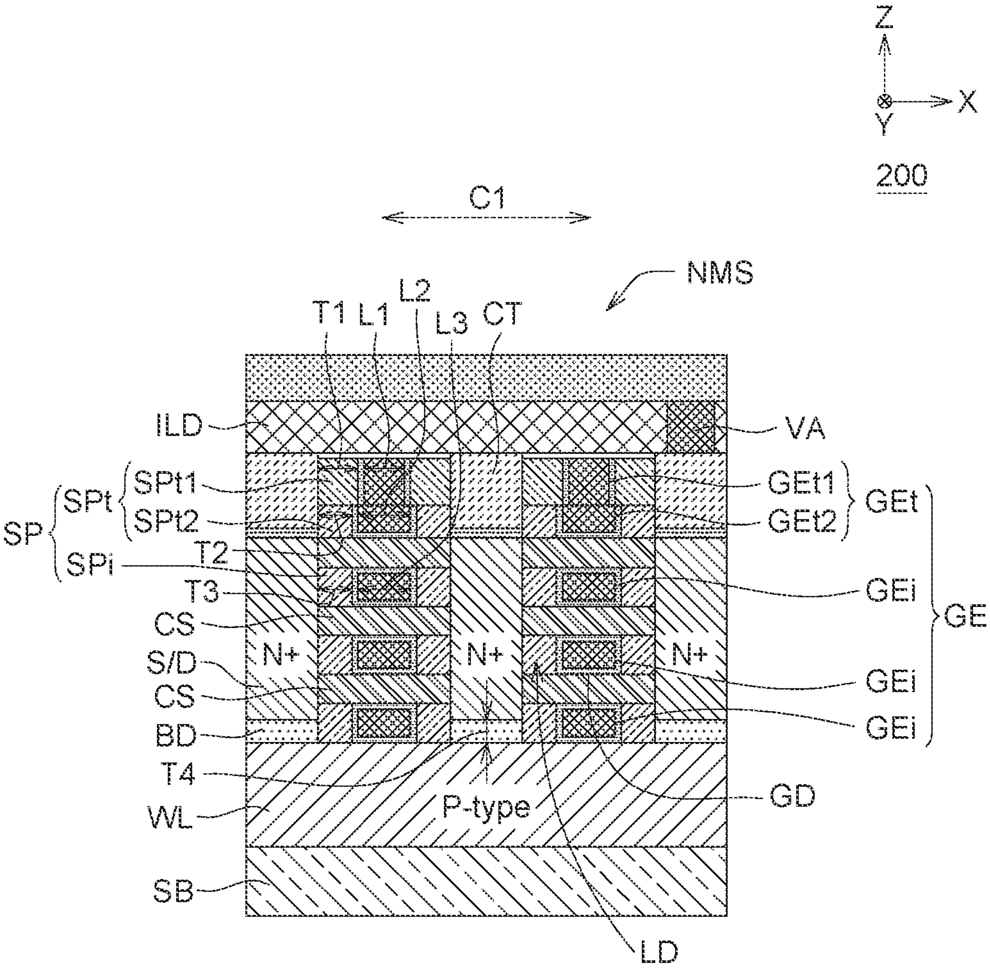
FIG. 6 shows a cross section view of a semiconductor structure 200 along the cutting line C1 (shown in the FIG. 1) according to another embodiment.
Figure 7:
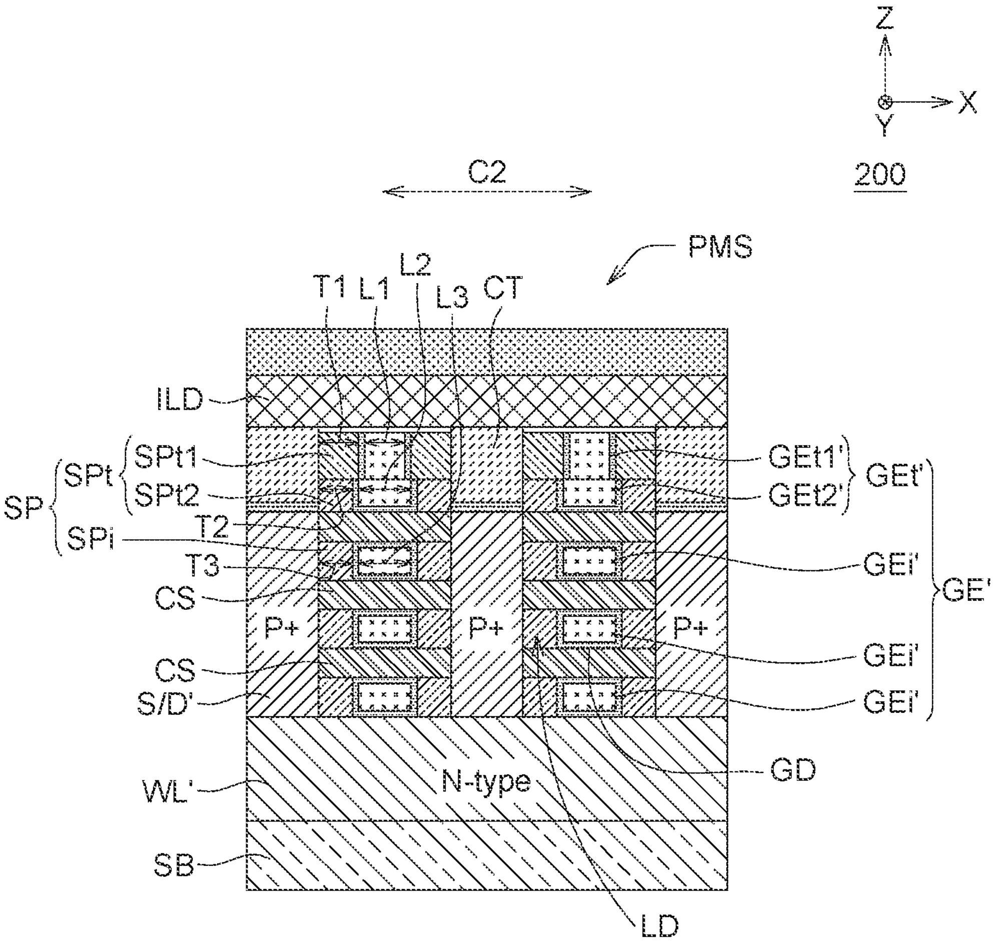
FIG. 7 shows a cross section view of the semiconductor structure 200 along the cutting line C2 (shown in the FIG. 1) according to another embodiment.
Figure 8:
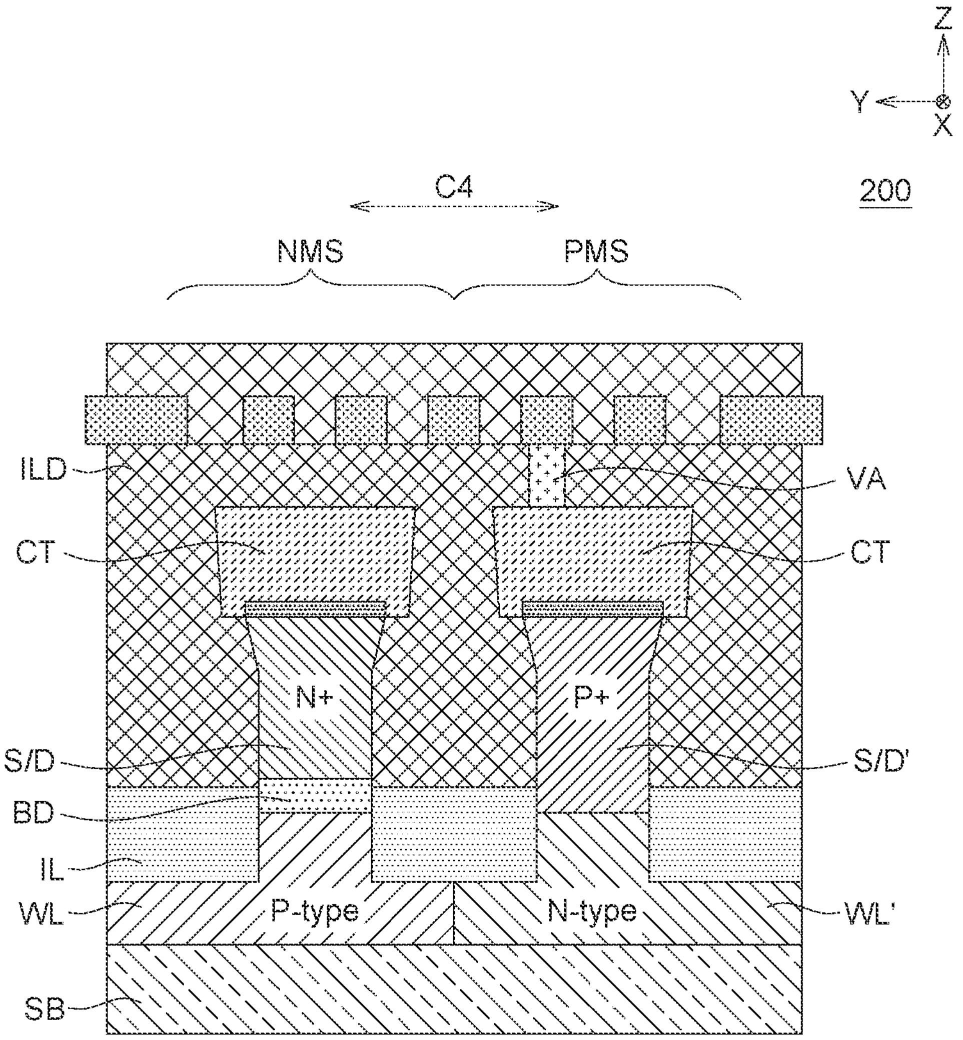
FIG. 8 shows a cross section view of the semiconductor structure 200 along the cutting line C4 (shown in the FIG. 1) according to another embodiment.

Please refer to FIG. 6 to FIG. 8. FIG. 6 shows a cross section view of a semiconductor structure 200 along the cutting line C1 (shown in the FIG. 1) according to another embodiment. FIG. 7 shows a cross section view of the semiconductor structure 200 along the cutting line C2 (shown in the FIG. 1) according to another embodiment. FIG. 8 shows a cross section view of the semiconductor structure 200 along the cutting line C4 (shown in the FIG. 1) according to another embodiment.

As shown in the FIGS. 6 and 8, the NMOSFET NMS of the semiconductor structure 200 includes a bottom dielectric layer BD. The bottom dielectric layer BD is located between the source/drain regions S/D and the wells WL in the NMOSFET NMS.

As shown in the FIGS. 7 and 8, the source/drain regions S/D' are directly connected to the wells WL' in the PMOSFET PMS without any bottom dielectric layer.

In one embodiment, as shown in the FIG. 6, a thickness T4 of the bottom dielectric layer BD is 2 nm to 30 nm. The source/drain regions S/D with the bottom dielectric layer BD could have better isolation margin for bottom planar.

Figure 9:
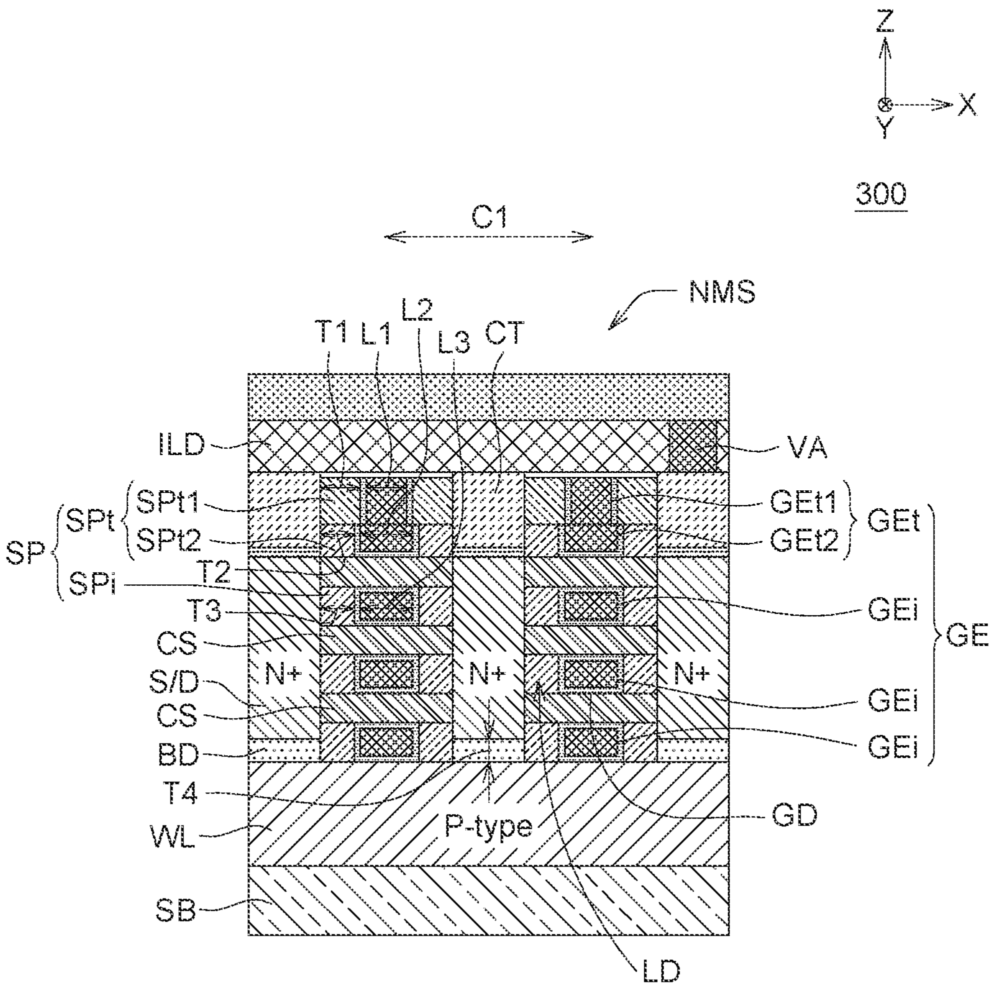
FIG. 9 shows a cross section view of a semiconductor structure 300 along the cutting line C1 (shown in the FIG. 1) according to another embodiment.
Figure 10:
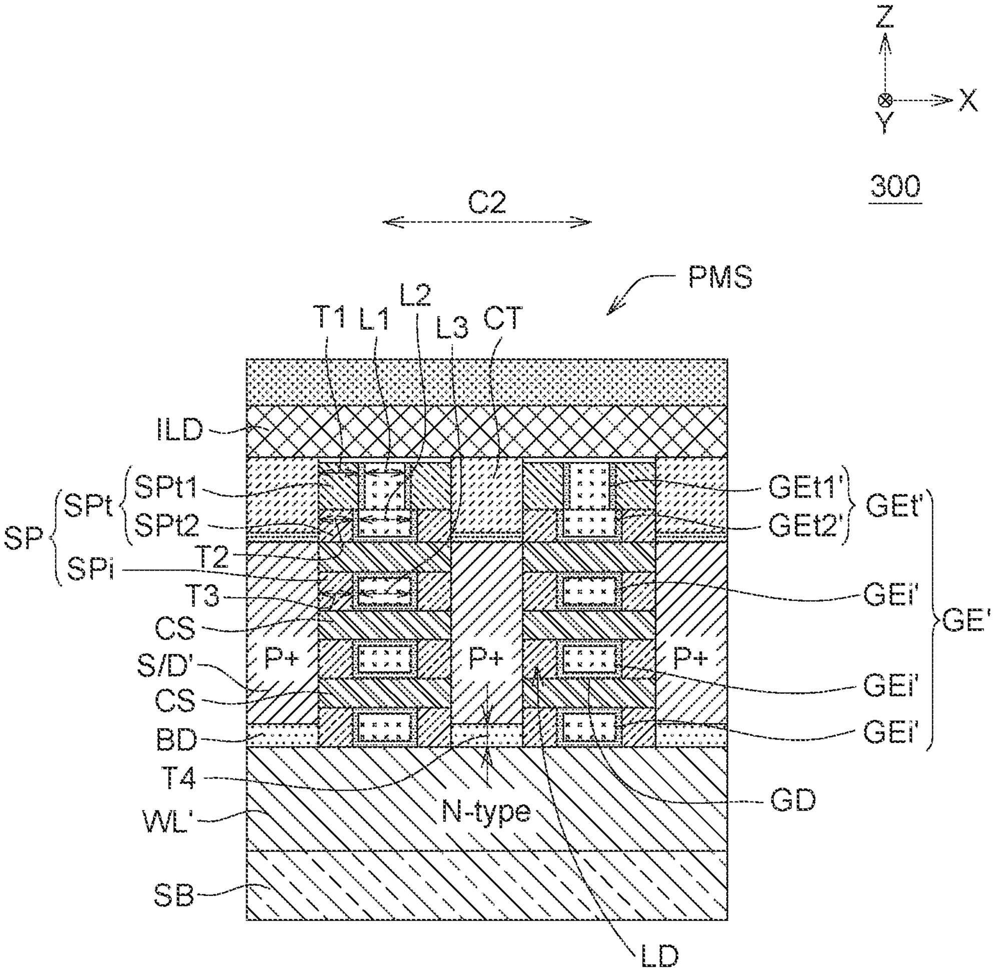
FIG. 10 shows a cross section view of the semiconductor structure 300 along the cutting line C2 (shown in the FIG. 1) according to another embodiment.
Figure 11:
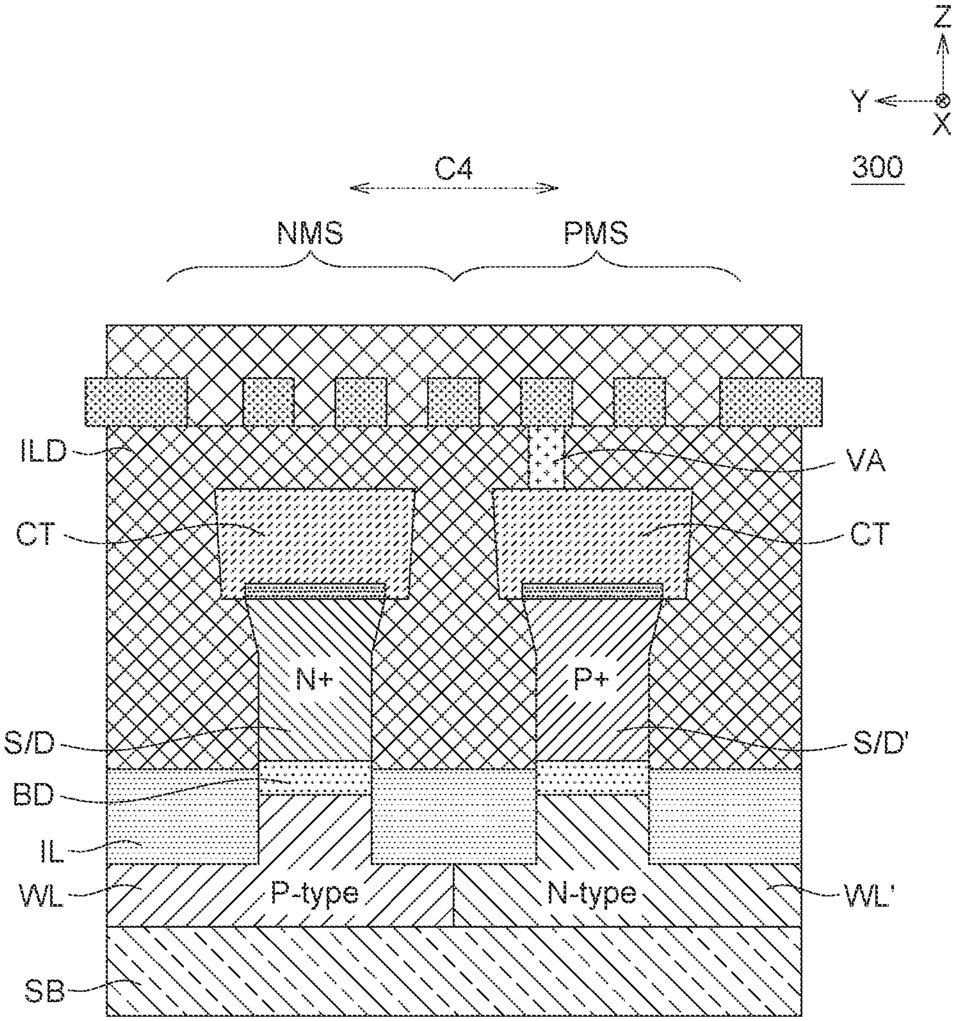
FIG. 11 shows a cross section view of the semiconductor structure 300 along the cutting line C4 (shown in the FIG. 1) according to another embodiment.

Please refer to FIG. 9 to FIG. 11. FIG. 9 shows a cross section view of a semiconductor structure 300 along the cutting line C1 (shown in the FIG. 1) according to another embodiment. FIG. 10 shows a cross section view of the semiconductor structure 300 along the cutting line C2 (shown in the FIG. 1) according to another embodiment. FIG. 11 shows a cross section view of the semiconductor structure 300 along the cutting line C4 (shown in the FIG. 1) according to another embodiment.

As shown in the FIGS. 9 and 11, the NMOSFET NMS of the semiconductor structure 300 includes the bottom dielectric layer BD. The bottom dielectric layer BD is located between the source/drain regions S/D and the wells WL in the NMOSFET NMS.

As shown in the FIGS. 10 and 11, the PMOSFET PMS of the semiconductor structure 300 includes the bottom dielectric layer BD. The bottom dielectric layer BD is located between the source/drain regions S/D' and the wells WL' in the PMOSFET PMS.

In one embodiment, as shown in the FIGS. 9 and 10, the thickness T4 of the bottom dielectric layer BD is 2 nm to 30 nm. The source/drain regions S/D, S/D' with the bottom dielectric layer BD could have better isolation margin for bottom planar.

Figure 12:
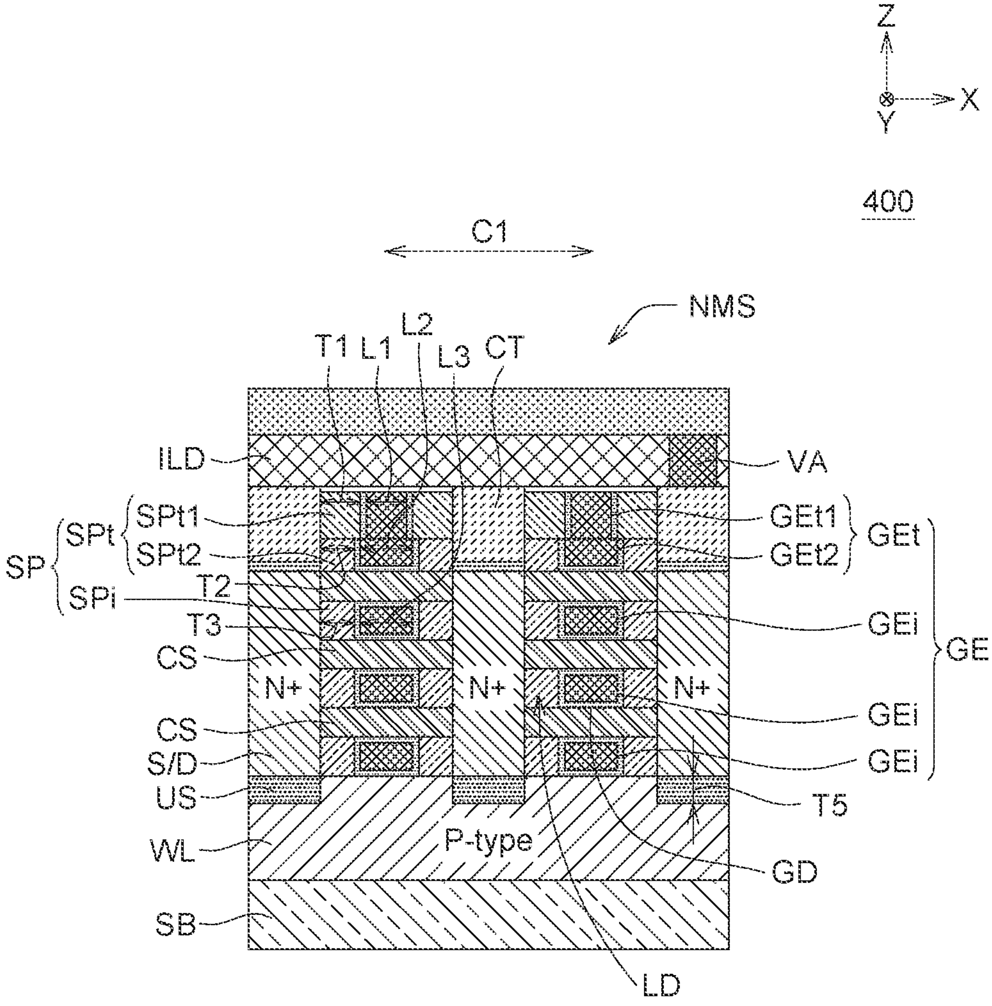
FIG. 12 shows a cross section view of a semiconductor structure 400 along the cutting line C1 (shown in the FIG. 1) according to another embodiment.
Figure 13:
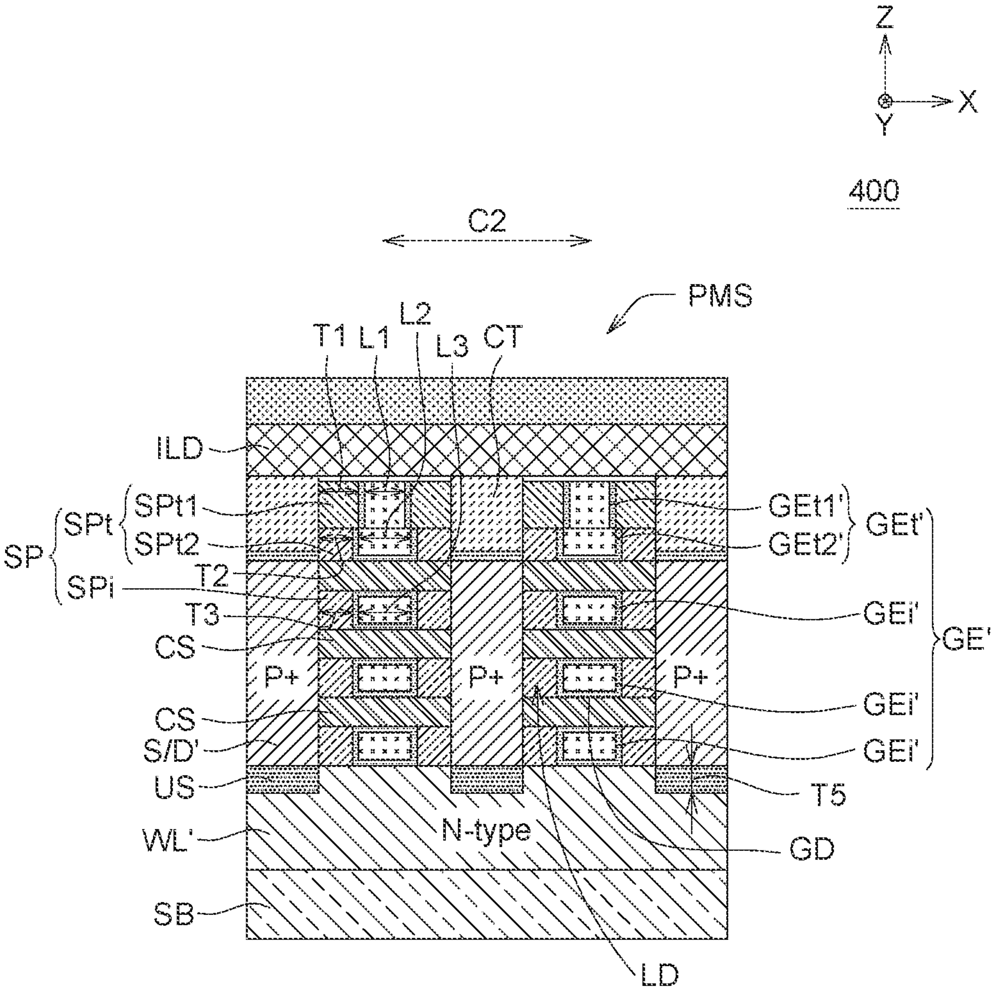
FIG. 13 shows a cross section view of the semiconductor structure 400 along the cutting line C2 (shown in the FIG. 1) according to another embodiment.
Figure 14:
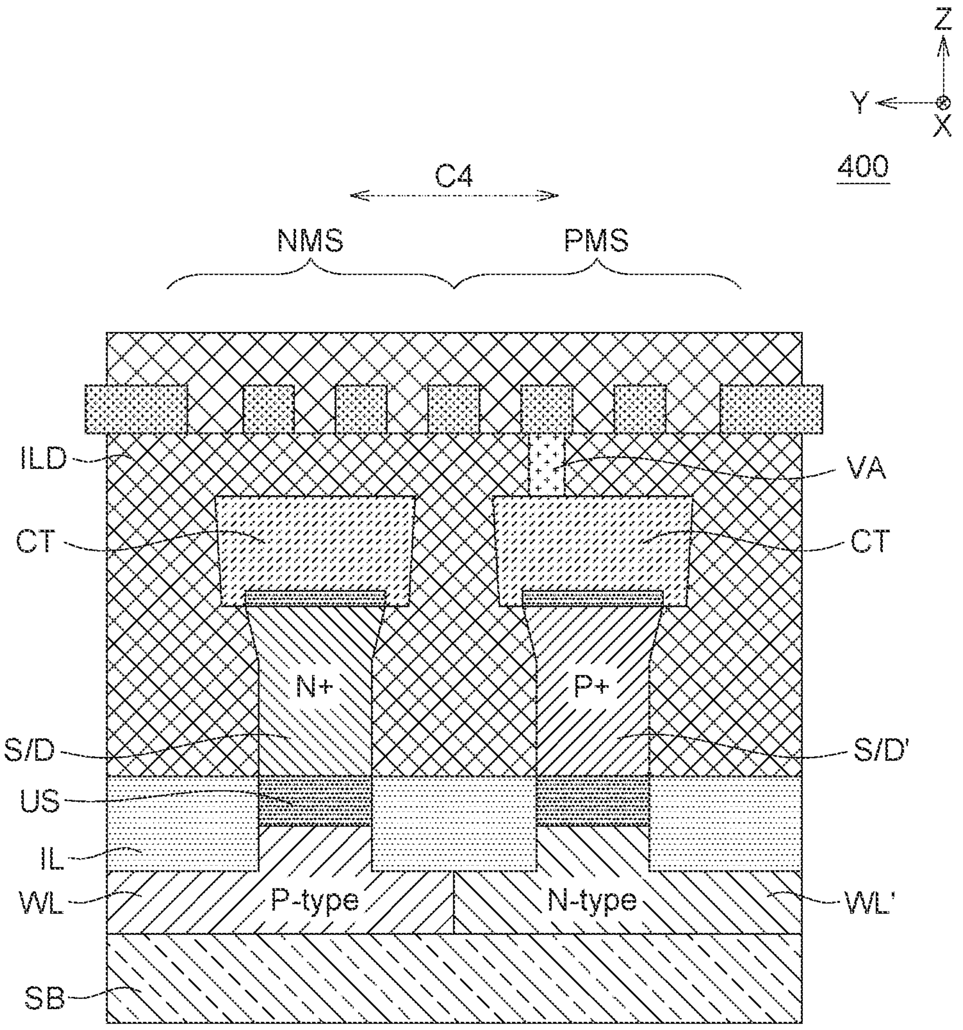
FIG. 14 shows a cross section view of the semiconductor structure 400 along the cutting line C4 (shown in the FIG. 1) according to another embodiment.

Please refer to FIG. 12 to FIG. 14. FIG. 12 shows a cross section view of a semiconductor structure 400 along the cutting line C1 (shown in the FIG. 1) according to another embodiment. FIG. 13 shows a cross section view of the semiconductor structure 400 along the cutting line C2 (shown in the FIG. 1) according to another embodiment. FIG. 14 shows a cross section view of the semiconductor structure 400 along the cutting line C4 (shown in the FIG. 1) according to another embodiment.

As shown in the FIGS. 12 and 14, the NMOSFET NMS of the semiconductor structure 400 includes an un-doped silicon epi layer US. The un-doped silicon epi layer US is located between the source/drain regions S/D and the wells WL in the NMOSFET NMS.

As shown in the FIGS. 13 and 14, the PMOSFET PMS of the semiconductor structure 400 includes the un-doped silicon epi layer US. The un-doped silicon epi layer US is located between the source/drain regions S/D' and the wells WL' in the PMOSFET PMS.

In one embodiment, as shown in the FIGS. 12 and 13, a thickness T5 of the un-doped silicon epi layer US is 5 nm to 40 nm. The source/drain regions S/D, S/D' with the un-doped silicon epi layer US could have better isolation margin for bottom planar.

Figure 15:
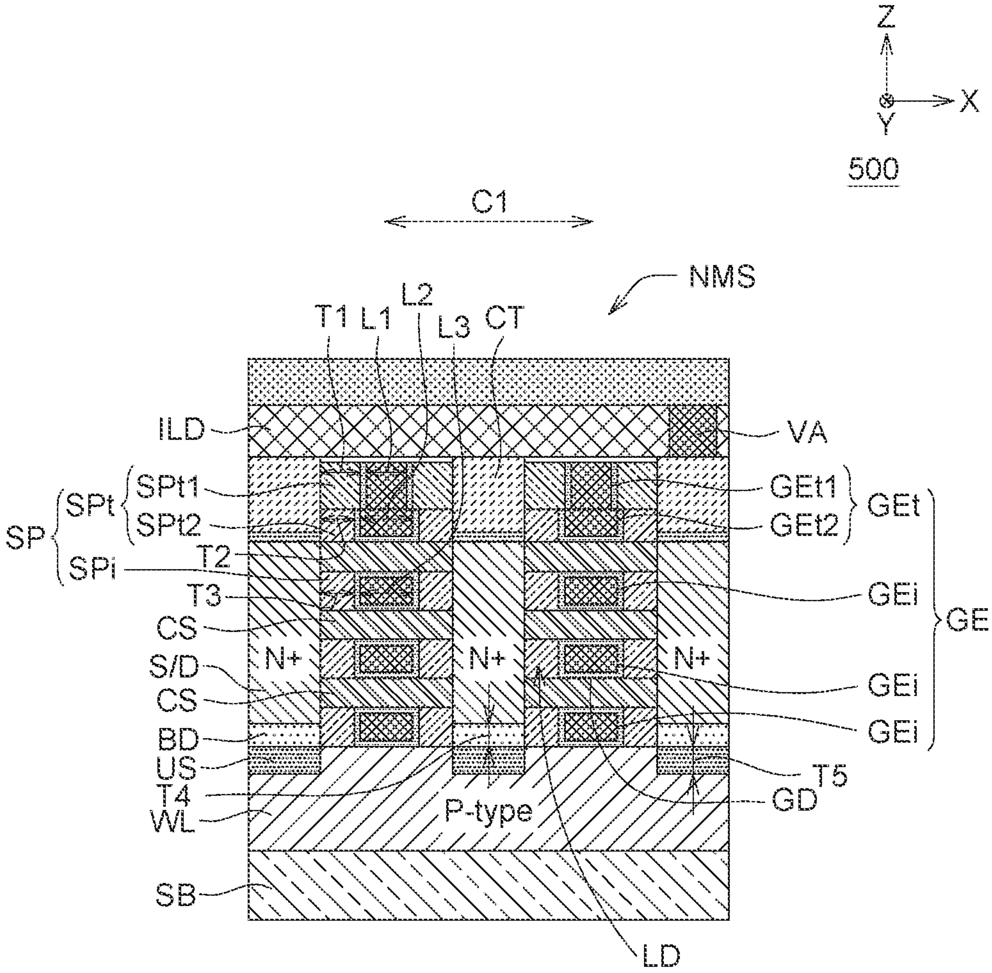
FIG. 15 shows a cross section view of a semiconductor structure 500 along the cutting line C1 (shown in the FIG. 1) according to another embodiment.
Figure 16:
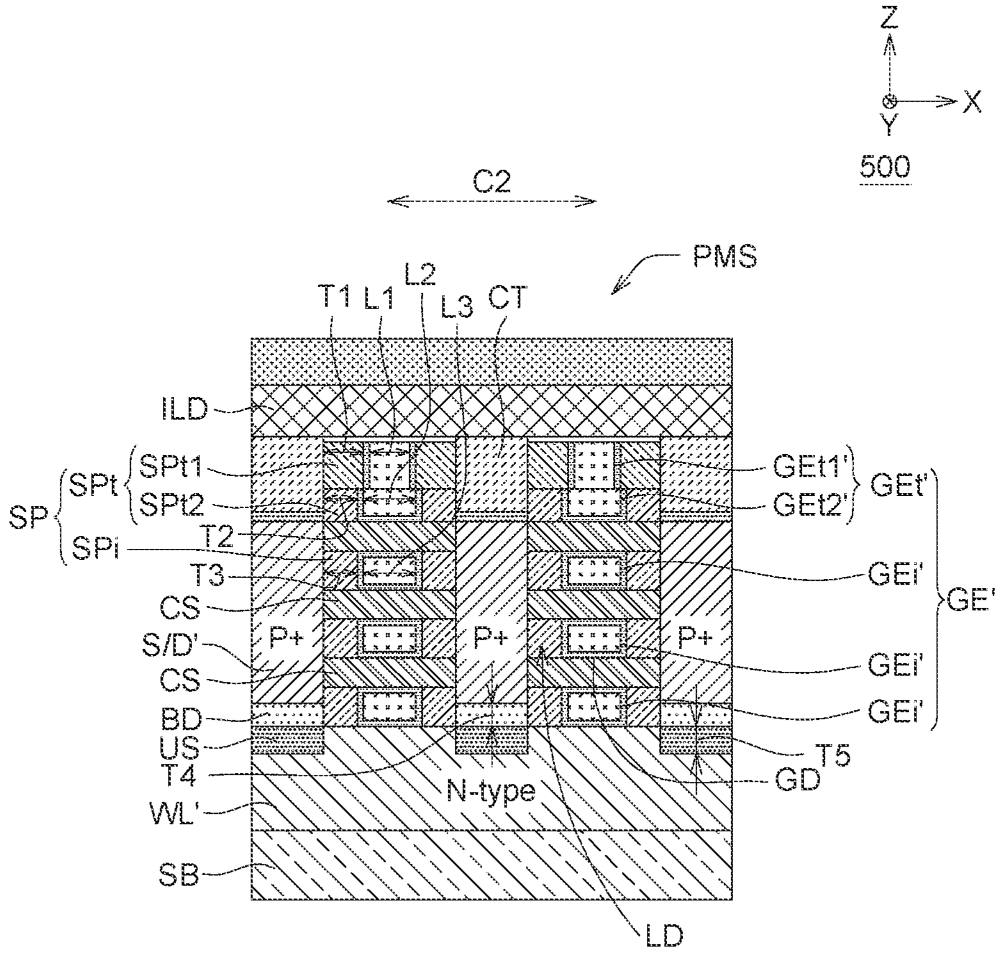
FIG. 16 shows a cross section view of the semiconductor structure 500 along the cutting line C2 (shown in the FIG. 1) according to another embodiment.
Figure 17:
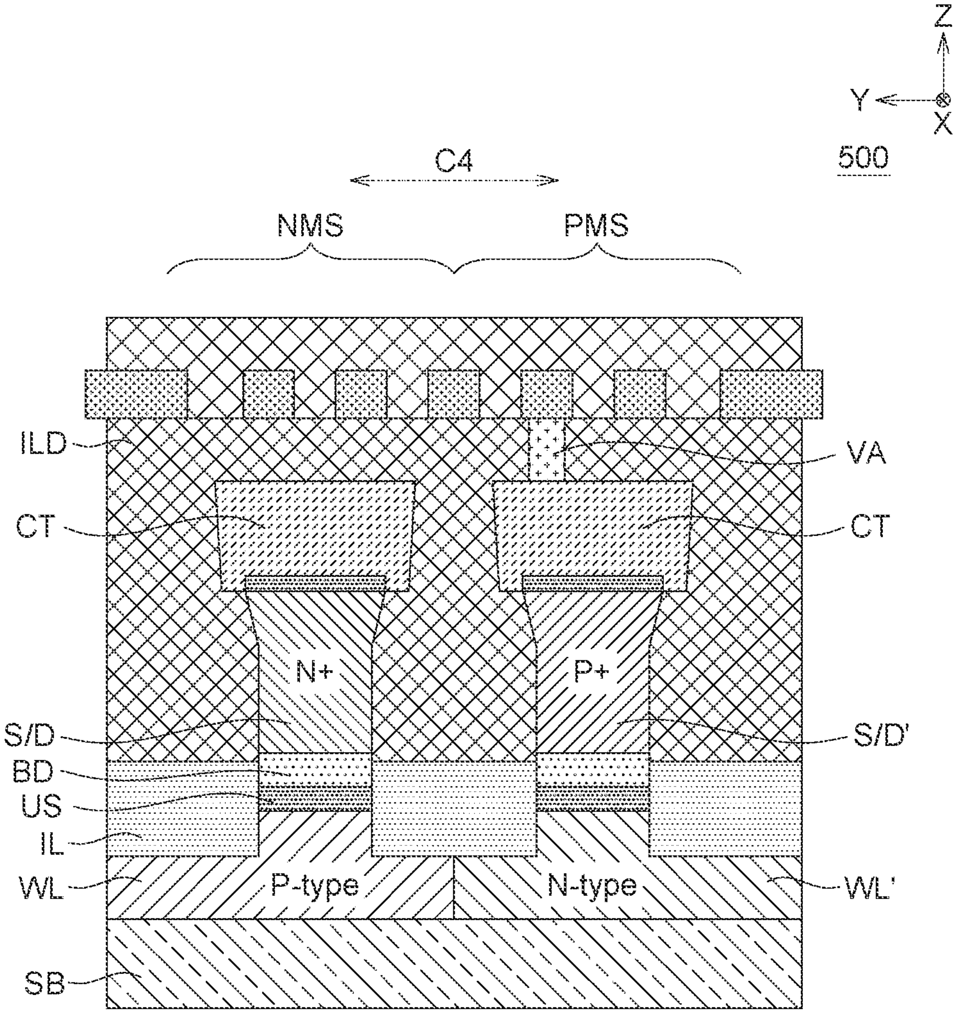
FIG. 17 shows a cross section view of the semiconductor structure 500 along the cutting line C4 (shown in the FIG. 1) according to another embodiment.

Please refer to FIG. 15 to FIG. 17. FIG. 15 shows a cross section view of a semiconductor structure 500 along the cutting line C1 (shown in the FIG. 1) according to another embodiment. FIG. 16 shows a cross section view of the semiconductor structure 500 along the cutting line C2 (shown in the FIG. 1) according to another embodiment. FIG. 17 shows a cross section view of the semiconductor structure 500 along the cutting line C4 (shown in the FIG. 1) according to another embodiment.

As shown in the FIGS. 15 and 17, the NMOSFET NMS of the semiconductor structure 500 includes the bottom dielectric layer BD and the un-doped silicon epi layer US. The bottom dielectric layer BD and the un-doped silicon epi layer US are located between the source/drain regions S/D and the wells WL in the NMOSFET NMS. The bottom dielectric layer BD is disposed on the un-doped silicon epi layer US.

As shown in the FIGS. 15 and 17, the PMOSFET PMS of the semiconductor structure 300 includes the bottom dielectric layer BD and the un-doped silicon epi layer US. The bottom dielectric layer BD and the un-doped silicon epi layer US are located between the source/drain regions S/D' and the wells WL' in the PMOSFET PMS. The bottom dielectric layer BD is disposed on the un-doped silicon epi layer US.

In one embodiment, as shown in the FIGS. 15 and 16, the thickness T4 of the bottom dielectric layer BD is 2 nm to 10 nm and the thickness T5 of the un-doped silicon epi layer US is 5 nm to 40 nm. The source/drain regions S/D, S/D' with the bottom dielectric layer BD and the un-doped silicon epi layer US could have better isolation margin for bottom planar.

Figure 18:
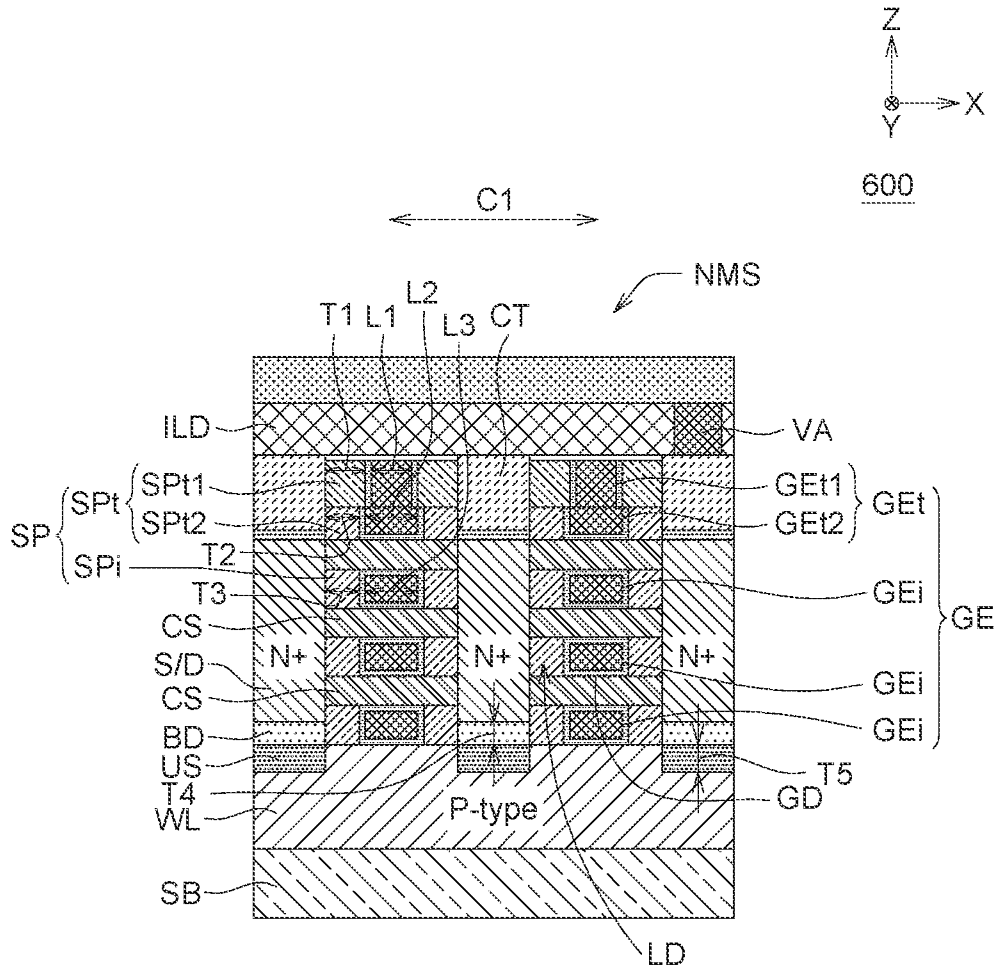
FIG. 18 shows a cross section view of a semiconductor structure 600 along the cutting line C1 (shown in the FIG. 1) according to another embodiment.
Figure 19:
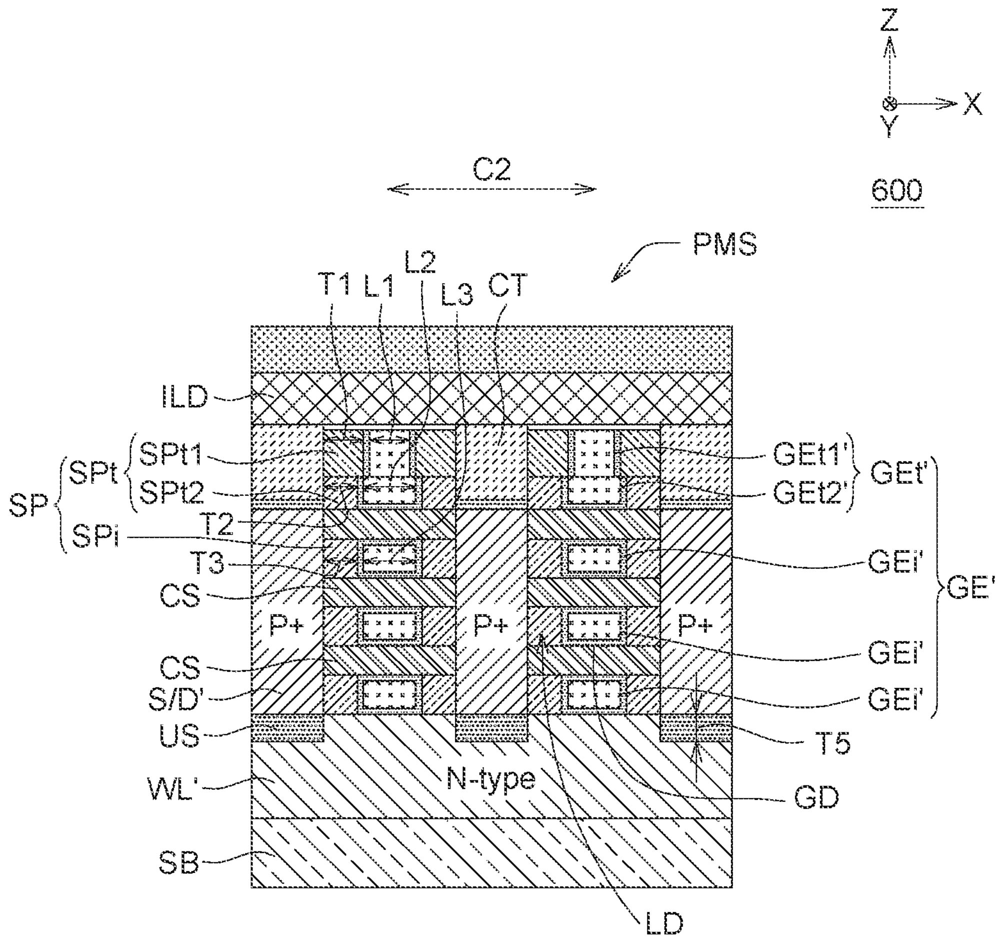
FIG. 19 shows a cross section view of the semiconductor structure 600 along the cutting line C2 (shown in the FIG. 1) according to another embodiment.
Figure 20:
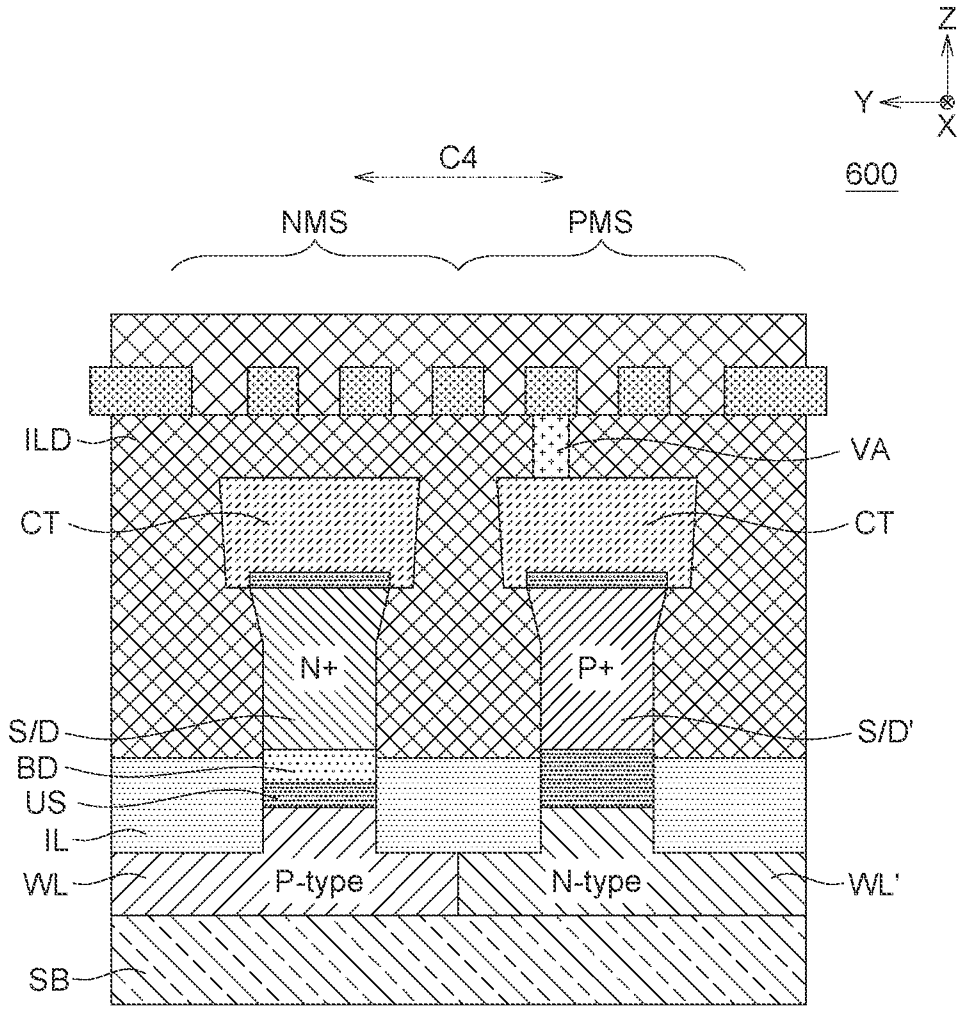
FIG. 20 shows a cross section view of the semiconductor structure 600 along the cutting line C4 (shown in the FIG. 1) according to another embodiment.

Please refer to FIG. 18 to FIG. 20. FIG. 18 shows a cross section view of a semiconductor structure 600 along the cutting line C1 (shown in the FIG. 1) according to another embodiment. FIG. 19 shows a cross section view of the semiconductor structure 600 along the cutting line C2 (shown in the FIG. 1) according to another embodiment. FIG. 20 shows a cross section view of the semiconductor structure 600 along the cutting line C4 (shown in the FIG. 1) according to another embodiment.

As shown in the FIGS. 18 and 20, the NMOSFET NMS of the semiconductor structure 600 includes the bottom dielectric layer BD and the un-doped silicon epi layer US. The bottom dielectric layer BD and the un-doped silicon epi layer US are located between the source/drain regions S/D and the wells WL in the NMOSFET NMS. The bottom dielectric layer BD is disposed on the un-doped silicon epi layer US.

As shown in the FIGS. 19 and 20, the PMOSFET PMS of the semiconductor structure 300 includes the un-doped silicon epi layer US. The un-doped silicon epi layer US is located between the source/drain regions S/D' and the wells WL' in the PMOSFET PMS.

In one embodiment, as shown in the FIG. 18, the thickness T4 of the bottom dielectric layer BD is 2 nm to 10 nm, and the thickness T5 of the un-doped silicon epi layer US is 5 nm to 40 nm. The source/drain regions S/D with the bottom dielectric layer BD and the un-doped silicon epi layer US and the source/drain regions S/D' with the un-doped silicon epi layer US could have better isolation margin for bottom planar.

According to the embodiments described in the FIGS. 1 to 5, two stages structure is used for the top gate GEt1, GEt1', the first stage top gate GEt1, GEt1' in the top gate electrodes GEt, GEt' has a less gate length, so the capacitance could be lowered, and the density could be improved. The second stage top gate GEt2, GEt2' has a longer gate length, so the leakage could be reduced.

According to the embodiments described in the FIGS. 1 to 5, two stages structure is used for the top spacer SPt. The first stage top spacer SPt1 has thicker thickness, so the capacitance between the contact CT and the gate electrode GE could be reduced and breakdown voltage for the contact CT to the gate electrode GE could be improved to enhance the reliability.

In the embodiments described in the FIGS. 6 to 20, the isolation layer which is the bottom dielectric layer BD, the un-doped silicon epi layer US or the combination thereof is formed between the source/drain region S/D (and/or S/D') and the well WL (and/or WL'). Therefore, the source/drain region S/D (and/or S/D') could have better isolation margin for bottom planar.

In one example embodiment, a semiconductor structure is provided. The semiconductor structure includes a substrate, a well, a plurality of channel sheets, a source/drain region, a contact, a gate electrode, a gate dielectric layer and a spacer. The well is disposed in the substrate. The plurality of channel sheets are vertically stacked above the well. Each of the plurality of channel sheets has a lightly doped source/drain (LDD) region. A source/drain region is disposed above the well and electrically connected to the LDD regions. The contact is electrically connected to the source/drain region. The gate electrode surrounds the plurality of channel sheets. The gate electrode includes at least one inner gate electrode and a top gate electrode. The at least one inner gate electrode is located between the plurality of channel sheets. The top gate electrode is located upon a top of the plurality of channel sheets. The top gate electrode includes a first stage top gate and a second stage top gate. The first stage top gate is stacked on the second stage top gate, and a first gate length of the first stage top gate is less than a second gate length of the second stage top gate. The gate dielectric layer surrounds the gate electrode. The spacer includes at least one inner spacer and a top spacer. The at least one inner spacer is located between the inner gate electrode and the source/drain region. The top spacer is located between the top gate electrode and the contact.

In one example embodiment based on any one of the previously disclosed example embodiments, a ratio of the second gate length to the first gate length is 1.05 to 1.4.

In one example embodiment based on any one of the previously disclosed example embodiments, a third gate length of the inner gate electrode is substantially equal to the second gate length.

In one example embodiment based on any one of the previously disclosed example embodiments, the top spacer includes a first stage top spacer and a second stage top spacer. The first stage top spacer is located between the first stage top gate and the contact. The second stage top spacer is located between the second stage top gate and the contact. The first stage top spacer is stacked on the second stage top spacer, and a material of the first stage top spacer is different from a material of the second stage top spacer.

In one example embodiment based on any one of the previously disclosed example embodiments, a first thickness of the first stage top spacer is larger than a second thickness of the second stage top spacer.

In one example embodiment based on any one of the previously disclosed example embodiments, a ratio of the first thickness to the second thickness is 1.05 to 1.5.

In one example embodiment based on any one of the previously disclosed example embodiments, a difference between the first thickness and the second thickness is 0.5 nm to 3 nm.

In one example embodiment based on any one of the previously disclosed example embodiments, a dielectric constant of the inner spacer is larger than a dielectric constant of the top spacer.

In another example embodiment, a semiconductor structure is provided. The semiconductor structure includes a substrate, a well, a plurality of channel sheets, a source/drain region, a contact, a gate electrode, a gate dielectric layer and a spacer. The well is disposed in the substrate. The plurality of channel sheets are vertically stacked above the well. Each of the channel sheets has a lightly doped source/drain (LDD) region. The source/drain region is disposed above the well and electrically connected to the LDD regions. The contact is electrically connected to the source/drain region. The gate electrode surrounds the channel sheets. The gate electrode includes at least one inner gate electrode, and a top gate electrode. The at least one inner gate electrode is located between the channel sheets. The top gate electrode is located upon a top of the channel sheets. The gate dielectric layer surrounds the gate electrode. The spacer includes at least one inner spacer and a top spacer. The at least one inner spacer is located between the inner gate electrode and the source/drain region. The top spacer is located between the top gate electrode and the contact. The top spacer includes a first stage top spacer and a second stage top spacer. The first stage top spacer is stacked on the second stage top spacer, and a material of the first stage top spacer is different from a material of the second stage top spacer.

In one example embodiment based on any one of the previously disclosed example embodiments, the first stage top spacer is located between the first stage top gate and the contact, and the second stage top spacer is located between the second stage top gate and the contact.

In one example embodiment based on any one of the previously disclosed example embodiments, a first thickness of the first stage top spacer is larger than a second thickness of the second stage top spacer.

In one example embodiment based on any one of the previously disclosed example embodiments, a ratio of the first thickness to the second thickness is 1.05 to 1.5.

In one example embodiment based on any one of the previously disclosed example embodiments, a difference between the first thickness and the second thickness is 0.5 nm to 3 nm.

In one example embodiment based on any one of the previously disclosed example embodiments, a dielectric constant of the inner spacer is larger than a dielectric constant of the top spacer.

In one example embodiment, a semiconductor structure is provided. The semiconductor structure includes a substrate, a well, a plurality of channel sheets, a source/drain region, a contact, a gate electrode, a gate dielectric layer, a spacer and an isolation layer. The well is disposed in the substrate. The plurality of channel sheets are vertically stacked above the well. Each of the channel sheets has a lightly doped source/drain (LDD) region. The source/drain region is disposed above the well and electrically connected to the LDD regions. The contact is electrically connected to the source/drain region. The gate electrode surrounds the channel sheets. The gate electrode includes at least one inner gate electrode and a top gate electrode. The at least one inner gate electrode is located between the channel sheets. The top gate electrode is located upon a top of the channel sheets. The top gate electrode includes a first stage top gate and a second stage top gate. The first stage top gate is stacked on the second stage top gate, and a first gate length of the first stage top gate is less than a second gate length of the second stage top gate. The gate dielectric layer surrounds the gate electrode. The spacer includes at least one inner spacer and a top spacer. The at least one inner spacer is located between the inner gate electrode and the source/drain region. The top spacer is located between the top gate electrode and the contact. The isolation layer is located between the source/drain region and the well.

In one example embodiment based on any one of the previously disclosed example embodiments, the isolation layer is a bottom dielectric layer, an un-doped silicon epi layer or a combination thereof.

In one example embodiment based on any one of the previously disclosed example embodiments, a thickness of the bottom dielectric layer is 2 nm to 30 nm.

In one example embodiment based on any one of the previously disclosed example embodiments, a thickness of the un-doped silicon epi layer is 5 nm to 40 nm.

In one example embodiment based on any one of the previously disclosed example embodiments, a ratio of the second gate length to the first gate length is 1.05 to 1.4.

In one example embodiment based on any one of the previously disclosed example embodiments, a third gate length of the inner gate electrode is substantially equal to the second gate length.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
- a substrate;
- a well, disposed in the substrate;
- a plurality of channel sheets, vertically stacked above the well, wherein each of the plurality of channel sheets has a lightly doped source/drain (LDD) region;
- a source/drain region, disposed above the well and electrically connected to the LDD regions;
- a contact, electrically connected to the source/drain region;
- a gate electrode, surrounding the plurality of channel sheets, wherein the gate electrode includes:
  - at least one inner gate electrode, located between the plurality of channel sheets; and
  - a top gate electrode, located upon a top of the plurality of channel sheets, wherein the top gate electrode includes:
    - a first stage top gate; and
    - a second stage top gate, wherein the first stage top gate is stacked on the second stage top gate, and a first gate length of the first stage top gate is less than a second gate length of the second stage top gate;
- a gate dielectric layer, surrounding the gate electrode; and
- a spacer, including:
  - at least one inner spacer, located between the at least one inner gate electrode and the source/drain region; and
  - a top spacer, located between the top gate electrode and the contact;
- wherein the top spacer includes:
- a first stage top spacer, located between the first stage top gate and the contact; and
- a second stage top spacer, located between the second stage top gate and the contact, wherein the first stage top spacer is stacked on the second stage top spacer, and a material of the first stage top spacer is different from a material of the second stage top spacer.

2. The semiconductor structure according to claim 1, wherein a third gate length of the at least one inner gate electrode is substantially equal to the second gate length.

3. The semiconductor structure according to claim 1, wherein a first thickness of the first stage top spacer is larger than a second thickness of the second stage top spacer.

4. The semiconductor structure according to claim 3, wherein a ratio of the first thickness to the second thickness is 1.05 to 1.5.

5. The semiconductor structure according to claim 3, wherein a difference between the first thickness and the second thickness is 0.5 nm to 3 nm.

6. The semiconductor structure according to claim 1, wherein a dielectric constant of the at least one inner spacer is larger than a dielectric constant of the top spacer.

7. A semiconductor structure, comprising:
- a substrate;
- a well, disposed in the substrate;
- a plurality of channel sheets, vertically stacked above the well, wherein each of the plurality of channel sheets has a lightly doped source/drain (LDD) region;
- a source/drain region, disposed above the well and electrically connected to the LDD regions;
- a contact, electrically connected to the source/drain region;
- a gate electrode, surrounding the plurality of channel sheets, wherein the gate electrode includes:
  - at least one inner gate electrode, located between the plurality of channel sheets; and
  - a top gate electrode, located upon a top of the plurality of channel sheets;
- a gate dielectric layer, surrounding the gate electrode; and
- a spacer, including:

at least one inner spacer, located between the at least one inner gate electrode and the source/drain region; and a top spacer, located between the top gate electrode and the contact, wherein the top spacer includes:

a first stage top spacer; and a second stage top spacer, wherein the first stage top spacer is stacked on the second stage top spacer, and a material of the first stage top spacer is different from a material of the second stage top spacer;

wherein the top gate electrode includes:

a first stage top gate; and a second stage top gate, wherein the first stage top gate is stacked on the second stage top gate, the first stage top spacer is located between the first stage top gate and the contact, and the second stage top spacer is located between the second stage top gate and the contact.

8. The semiconductor structure according to claim 7, wherein a first thickness of the first stage top spacer is larger than a second thickness of the second stage top spacer.

9. The semiconductor structure according to claim 7, wherein a ratio of the first thickness to the second thickness is 1.05 to 1.5.

10. The semiconductor structure according to claim 7, wherein a difference between the first thickness and the second thickness is 0.5 nm to 3 nm.

11. The semiconductor structure according to claim 7, wherein a dielectric constant of the at least one inner spacer is larger than a dielectric constant of the top spacer.

12. A semiconductor structure, comprising:

a substrate;

a well, disposed in the substrate;

a plurality of channel sheets, vertically stacked above the well, wherein each of the plurality of channel sheets has a lightly doped source/drain (LDD) region;

a source/drain region, disposed above the well and electrically connected to the LDD regions;

a contact, electrically connected to the source/drain region;

a gate electrode, surrounding the plurality of channel sheets, wherein the gate electrode includes:

at least one inner gate electrode, located between the plurality of channel sheets; and a top gate electrode, located upon a top of the plurality of channel sheets, wherein the top gate electrode includes:

a first stage top gate; and a second stage top gate, wherein the first stage top gate is stacked on the second stage top gate, and a ratio of a second gate length of the second stage top gate to a first gate length of the first stage top gate is 1.05 to 1.4;

a gate dielectric layer, surrounding the gate electrode; and a spacer, including:

at least one inner spacer, located between the at least one inner gate electrode and the source/drain region; and a top spacer, located between the top gate electrode and the contact;

wherein the top spacer includes:

a first stage top spacer, located between the first stage top gate and the contact; and a second stage top spacer, located between the second stage top gate and the contact, wherein the first stage top spacer is stacked on the second stage top spacer and a material of the first stage top spacer is different from a material of the second stage top spacer.

13. The semiconductor structure according to claim 12, wherein a third gate length of the at least one inner gate electrode is substantially equal to the second gate length.

14. The semiconductor structure according to claim 12, wherein a first thickness of the first stage top spacer is larger than a second thickness of the second stage top spacer.

15. The semiconductor structure according to claim 14, wherein a ratio of the first thickness to the second thickness is 1.05 to 1.5.

16. The semiconductor structure according to claim 14, wherein a difference between the first thickness and the second thickness is 0.5 nm to 3 nm.

17. The semiconductor structure according to claim 12, wherein a dielectric constant of the at least one inner spacer is larger than a dielectric constant of the top spacer.

18. The semiconductor structure according to claim 1, wherein a third gate length of the at least one inner gate electrode is greater than the first gate length.

19. The semiconductor structure according to claim 7, wherein a third thickness of the at least one inner spacer is substantially equal to a second thickness of the second stage top spacer.

20. The semiconductor structure according to claim 12, wherein a third gate length of the at least one inner gate electrode is greater than the first gate length.

* * * * *